United States Patent [19]
Iwano et al.

[11] Patent Number: 5,623,509
[45] Date of Patent: Apr. 22, 1997

[54] SEMICONDUCTOR LASER AND LIGHT-SENSING DEVICE USING THE SAME

[75] Inventors: Hideaki Iwano; Osamu Yokoyama; Hiroaki Nomura, all of Suwa, Japan

[73] Assignee: Seiko Epson Corporation, Tokyo, Japan

[21] Appl. No.: 395,886

[22] Filed: Feb. 28, 1995

[30] Foreign Application Priority Data

Mar. 1, 1994 [JP] Japan .................................. 6-056580

[51] Int. Cl.⁶ .................................................. H01S 3/19
[52] U.S. Cl. .............................. 372/45; 372/46; 372/24; 372/49
[58] Field of Search .............................. 372/46, 45, 43, 372/24, 49

[56] References Cited

U.S. PATENT DOCUMENTS

| | | | |
|---|---|---|---|
| 4,092,659 | 5/1978 | Ettenberg . | |
| 5,018,804 | 5/1991 | Jung et al. | 359/19 |
| 5,189,679 | 2/1993 | Derry et al. . | |
| 5,317,586 | 5/1994 | Thornton et al. | 372/46 |

FOREIGN PATENT DOCUMENTS

| | | |
|---|---|---|
| 349193 | 1/1990 | European Pat. Off. . |
| 578836 | 1/1994 | European Pat. Off. . |
| 59-198377 | 11/1984 | Japan . |
| 61-149876 | 7/1986 | Japan . |
| 5-190977 | 7/1993 | Japan . |
| 5-190976 | 7/1993 | Japan . |
| 5-333149 | 12/1993 | Japan . |

OTHER PUBLICATIONS

IEEE Journal of Quantum Electronics, vol. 27, No. 6, Jun. 1991, "*High–Power Operation of Broad–Area Laser Diodes with GaAs and AlGaAs Single Quantum Wells for Nd:YAG Laser Pumping*", Kimio Shigihara et al., pp. 1537–1543.

IEEE Journal of Quantum Electronics, vol. 29, No. 6, Jun. 1993, "*Optimum Asymmetric Mirror Facet Structure for High–Efficiency Semiconductor Lasers*", Toshio Higashi et al., pp. 1918–1923.

Patent Abstracts of Japan, vol. 8, No. 48, "*Photodetector of Optical Reader*", Hideo Suenaga et al. & JP-A-58-199447, Nov. 1983.

Patent Abstracts of Japan, vol. 10, No. 351, "*Slit Light Source*", Tsugito Maruyama et al. & JP-A-61-149919, Jul. 1986.

Patent Abstracts of Japan, vol. 12, No. 483, "*Lens*", Koji Kamisaka & JP-A-63-199301, Aug. 1988.

Primary Examiner—Rodney B. Bovernick
Assistant Examiner—Yisun Song
Attorney, Agent, or Firm—Oliff & Berridge

[57] ABSTRACT

A semiconductor laser comprises AlGaAs-type semiconductor layers deposited on a substrate and a current constriction layer having at least one stripe-shaped current injection region. This semiconductor layers comprise: a first cladding layer of the first conductivity type, a first optical waveguide layer of the first conductivity type formed on the first cladding layer, an active layer formed on the first optical waveguide layer and having a quantum-well structure, a second optical waveguide layer of a second conductivity type formed on the active layer, a second cladding layer of the second conductivity type formed on the second optical waveguide layer, and a contact layer formed on the second cladding layer. The active layer has flatness of such a degree that roughness with respect to a reference surface within a unit area of 1 mm×1 mm is no more than ±0.1 µm, the width of the current injection region of the current constriction layer is between 100 µm to 250 µm, and the resonator length is between 500 µm to 1,000 µm.

17 Claims, 17 Drawing Sheets

SEMICONDUCTOR LASER AND LIGHT-SENSING DEVICE USING THE SAME

BACKGROUND OF THE INVENTION

1. Field of the Invention

The present invention relates to a high-power semiconductor laser that is suitable as the light source for a distance measurement system or device, and a light-sensing device using this semiconductor laser.

2. Description of Prior Art

There have recently been experiments into using semiconductor lasers as light sources in the field of distance measurement, in applications such as measuring the spacing between vehicles. When a semiconductor laser is used to measure a distance, high-power pulses of light are emitted toward a target, and the distance to the target is calculated from the time taken from the emission of the pulsed light until the reception of light reflected from the target.

The characteristics demanded of a semiconductor laser capable of performing in this manner are (a) an ability to lase at a high power level of, for example, a maximum output of at least 50 W, (b) a single-peaked far-field pattern, (c) no delay in the lasing, and (d) emission of light in a wavelength region that is not easily affected by sunlight. Of these characteristics, the output and lasing wavelength of a semiconductor laser greatly influence the capabilities of the distance measurement apparatus. In other words, the output of the semiconductor laser affects the distance travelled by the light, so that the distance the light travels increases as the light output increases, and thus the measurable range also increases.

Another point concerning the lasing wavelength of the laser is that it is advantageous to have a longer wavelength. If, for example a distance measurement apparatus is used as a vehicle-spacing measurement apparatus, sunlight would interfere as noise in this distance measurement apparatus. In order to avoid the problem of such noise, generally a bandpass filter that passes only light of the same wavelength of the laser light is placed in front of the light-receiving sensor, in order to cut out as much of the sunlight as possible. Nevertheless, it is impossible to prevent sunlight of the same wavelength as the laser light from being incident on the light-receiving sensor. The energy density distribution of sunlight reaches as low as the long wavelengths of the infrared region. This means that the effects of sunlight would be less likely to become a problem if the lasing wavelength of the laser could be made longer, and thus noise due to sunlight would be reduced.

However, the maximum output of a popular semiconductor laser is approximately 20 W. Achieving a greater output causes problems in that the output becomes thermally saturated and thus efficiency drops, or the output drops because of an increase in injection current density, or the edge surfaces of the laser become damaged. If a semiconductor laser is used as a light source of a distance measurement apparatus, the distance that can be measured with a laser of a maximum output of approximately 20 W is less than 100 meters, and thus highly accurate measurement is difficult when the object to be inspected is beyond that distance.

Techniques disclosed in, for example, Japanese Patent Application Laid-Open Nos. 59-198377 and 61-149876, are intended for application to distance-measuring systems that use semiconductor lasers. Each technique involves the provision of a plurality of light-transmitting devices with beams of differing angles of projection for far and near distances as the radar for measuring vehicle spacing, in order to enable measurement over a wide range from far to close distances. In the technique disclosed in the former patent application, the light from one light source is split by optical fibers to form a plurality of light sources, or a plurality of independent light sources are used, and lenses with differing angles of projection corresponding to the light sources are provided independently to implement far and near illumination. The technique disclosed in the latter patent application allocates the far and near illumination to a plurality of light sources and lenses for adjusting the angles of projection of the light sources that are arranged independently.

Each of these techniques is advantageous in that it has the function of reducing dead angles when used in a radar that can measure over a wide range from far to close distances. However, a plurality of light sources is necessary in the above described structures, and an independent optical system must be provided for each light source, which not only makes the apparatus complicated, but difficult to make it compact.

SUMMARY OF THE INVENTION

An objective of the present invention is to provide a high-power semiconductor laser that has a long wavelength such as at least 850 nm which is not greatly affected by sunlight, and a maximum output of, for example, at least 50 W.

Another objective of the present invention is to provide a light-sensing device using the above described high-power semiconductor laser as a light source, which can implement a predetermined illumination pattern by a simple optical system.

The semiconductor laser of the present invention comprises a substrate formed of a compound semiconductor of a first conductivity type, semiconductor layers deposited on one surface of the substrate, a current constriction layer having at least one stripe-shaped current injection region, and a pair of reflective layers formed on edge surfaces of the substrate and the semiconductor layers, wherein:

the semiconductor layers comprise:

a first cladding layer of the first conductivity type positioned on the substrate side, a first optical waveguide layer of the first conductivity type formed on the first cladding layer, an active layer formed on the first optical waveguide layer and having a quantum-well structure, a second optical waveguide layer of a second conductivity type formed on the active layer, a second cladding layer of the second conductivity type formed on the second optical waveguide layer, and a contact layer formed on the second cladding layer, and wherein:

the active layer has flatness of such a degree that roughness with respect to a reference surface within a unit area of 1 mm×1 mm is no more than ±0.1 µm, the width of the current injection region of the current constriction layer is between 100 µm to 250 µm, and the resonator length is between 500 µm to 1,000 µm.

In this semiconductor laser, the semiconductor layers are preferably formed of AlGaAs-type compound semiconductors.

When referring to the flatness of the active layer, the reference surface is a plane above the active layer, and has a height which corresponds to the average thickness of the substrate and the layer which comprises the active layer and the semiconductor layers below the active layer. Roughness means the height or depth of any convex or concave portions of the surfaces, or unevenness in the film thickness, found by measuring the surface with a contact-type film roughness meter or a Nomarski-type film roughness measurement method. The reference surface can be specified by, for example, the following method. In other words, the epitaxial growth on the substrate is terminated after the active layer is grown. Then, the exposed active layer surface is measured by, for example, a contact-type film roughness meter, so as to obtain the thickness distribution of the substrate and the layer comprising the active layer and the semiconductor layers below the active layer. By obtaining the average film thickness of the substrate and the layer per unit area, it is possible to specify a reference surface. With a high-power semiconductor laser that has a wide lasing region, it is particularly easy for roughness in the active layer to incur unregulated spot-shaped lasing.

The semiconductor laser can emit high-power light of a long wavelength of, for example, at least 850 nm and at a maximum power of, for example, at least 50 W. Further, the laser can emit laser light having a uniform luminous intensity distribution within a wide lasing region of approximately 100 μm to 250 μm.

This semiconductor laser preferably has a configuration such that the active layer comprises well and barrier layers, the value of x in the $Al_xGa_{1-x}As$ of a well layer is 0, the value of x in the $Al_xGa_{1-x}As$ of a barrier layer is between 0.15 to 0.25, and the value of x in the $Al_xGa_{1-x}As$ of the cladding layers is at least 0.28.

Specifying the Al compositions of the active layer and the cladding layers makes it possible to control any shift in the lasing wavelength towards a shorter wavelength and thus enable it to lase at a long wavelength of at least 850 nm, regardless of the fact that the active layer has a quantum-well structure.

In this semiconductor laser, the pair of reflective layers formed on edge surface of the laser is preferably formed of a combination of a first reflective layer of a reflectivity of 0.1% to 5% and a second reflective layer of a reflectivity of at least 98.5%. Each reflective layer is preferably formed of a dielectric film configured of one or more pairs of two thin dielectric films of differing refractive indices deposited alternately. These two thin dielectric films are arranged in such a manner that in the first reflective layer a thin dielectric film with the larger refractive index is deposited on the semiconductor layers side, while in the second reflective layer a thin dielectric film with the smaller refractive index is deposited on the semiconductor layers side.

Controlling the reflectivities of the reflective layers to be in the foregoing ranges makes it possible to obtain a high external differential quantum efficiency, and thus obtain a high light output, while preventing any increase in the lasing threshold current. Regulating the sequence in which the thin dielectric films forming the reflective layers in the above described manner ensures that the first reflective layer has a low reflectivity and the second reflective layer has a high reflectivity.

In addition to the configuration described above, the semiconductor laser of the present invention also preferably comprises at least one blocking layer formed between the first cladding layer and the first optical waveguide layer, and between the second cladding layer and the second optical waveguide layer. The value of x in the $Al_xGa_{1-x}As$ of the first and second cladding layers of this semiconductor laser is preferably between 0.20 to 0.40. The blocking layers each have preferably film thickness of between 8 nm to 20 nm, and the value of x in the $Al_xGa_{1-x}As$ thereof is preferably between 0.30 to 0.60.

With this variation of the semiconductor laser, a thin blocking layer is interposed between a cladding layer and an optical waveguide layer, so that the light-emitting efficiency and temperature characteristic can be improved without increasing the Al composition of the cladding layers. Reducing the Al composition of the cladding layers decreases the optical confinement factor, so that the semiconductor laser can produce a beam with a narrow radiation angle and the edge surfaces become less susceptible to damages.

Even with a semiconductor laser that includes this blocking layer, a high light output can be obtained by applying a configuration in which the reflectivities of the reflective layers and the sequence in which the dielectric films of the reflective layers are deposited are similar to those described above. Similarly, a low reflectivity can be obtained for the first reflective layer and a high reflectivity can be obtained for the second reflective layer.

A light-sensing device in accordance with another aspect of the present invention comprises:

a light source that is the semiconductor laser as defined by any of the above aspects of the present invention;

a light-transmitting optical system comprising at least a diffraction grating surface and a lens surface having different refractive powers in two directions that are mutually orthogonal and are also orthogonal to an optical axis, on the optical axis of light emitted from the light source; and a light-receiving portion for detecting light which is the emitted light that is reflected back by an object to be detected.

The lens surface having different refractive powers in two directions that are mutually orthogonal and are also orthogonal to the optical axis is preferably configured of a toric surface or anamorphic aspheric surface.

Since this light-sensing device has at least one lens surface having different refractive powers in two directions that are mutually orthogonal and are also orthogonal to the optical axis, such as a toric surface or an anamorphic aspheric surface, the beam pattern from the light source can be converted into a predetermined shape having sufficient light density. In addition, the provision of the diffraction grating surface makes it possible to convert the single beam from the light source into a plurality of beams. Thus, a beam having a predetermined projected light pattern can be obtained from a single light source by combining this lens surface and diffraction grating surface. As a result, the projector device of the light-sensing device of the present invention can easily be made simpler and more compact, making it suitable for use in a device such as a vehicle-mounted obstacle detector.

The main functions of the lens surface having different refractive powers in two directions that are mutually orthogonal and are also orthogonal to the optical axis are to adjust the shape of an elliptical laser beam into a roughly rectangular shape, and also increase the light density thereof.

In this light-sensing device, the light-transmitting optical system preferably comprises an aspheric lens surface that is rotationally symmetrical about the optical axis.

The aspheric lens surface that is rotationally symmetrical about the optical axis is a lens surface approximated by Equation 1.

$$Z = \frac{cr^2}{1 + \sqrt{1 - (1+k)c^2 r^2}} Ar^4 + Br^6 \quad (1)$$

where:

Z: Distance from the connection surface at the apex of the aspheric surface to a point on the aspheric surface
r: Distance from the optical axis
c: Curvature of the optical axis apex
k: Conical constant
A, B: Aspheric coefficients This aspheric lens surface that is rotationally symmetrical about the optical axis also has the useful advantage of correcting any aberration in the light source beam.

Note that the positions of the lens surface and diffraction grating surface are not particularly limited; these two surfaces could be arranged in any order with respect to the light source. However, the lens surface having different refractive powers in two directions is preferably placed closer to the light-source side than the diffraction grating surface. Since the adoption of this positional relationship makes it possible to roughly control the angle of projection of the laser light by adjusting the angle of diffraction caused by the diffraction grating, it provides an easily adjustable optical system.

If the light-sensing device of the present invention is used in, for example, a vehicle-mounted obstacle detector, it is necessary to provide a wide angle of projection in order to increase the measurable range in the region close to the moving vehicle, and it is also preferable that the light is projected as far as possible in the direction of movement. To satisfy these conditions, it is preferable that the diffraction grating surface has a grating pitch of between 20 μm to 50 μm. It is also preferable that the diffraction grating surface converts light emitted from the light source into at least three beams, and has zero-order diffraction efficiency of more than 50%.

BRIEF DESCRIPTION OF THE DRAWINGS

FIG. 15A shows location and beam shape in the Y-Z plane and FIG. 15B shows those in the X-Z plane;

FIG. 19A shows the light-transmitting optical system in the Y-Z plane and FIG. 19B shows that in the X-Z plane.

DESCRIPTION OF THE PREFERRED EMBODIMENTS

First Embodiment

Figure 1:
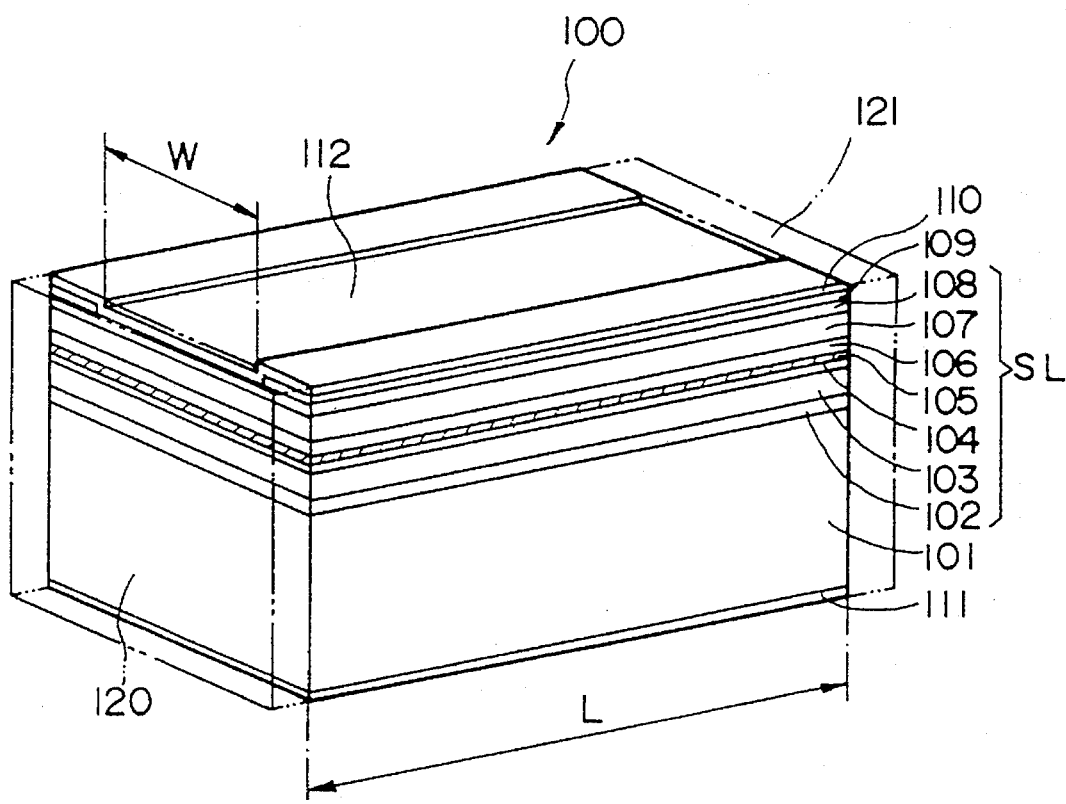
FIG. 1 is a schematic perspective view of a first embodiment of a semiconductor laser of the present invention.

FIG. 1 is a simplified perspective view of an example of a semiconductor laser to which the present invention is applied. A semiconductor laser 100 shown in FIG. 1 has a semiconductor layer stack SL formed of a plurality of AlGaAs-type compound semiconductor layers deposited on an n-type GaAs substrate 101. This semiconductor layer stack SL comprises an n-type buffer layer 102, an n-type first cladding layer 103, an n-type first optical waveguide layer 104, an active layer 105, a p-type second optical waveguide layer 106, a p-type second cladding layer 107, and p-type contact layer 108. Details of the Al composition, film thickness, and dopant of each of these semiconductor layers are given in Table 1. Note that values in parentheses in the columns of Table 1 indicate the configuration of samples of semiconductor lasers that were used in experiments that will be described later.

TABLE 1

|  | Al Composition | Film Thickness (μm) | Dopant |
| --- | --- | --- | --- |
| Buffer layer (102) | 0 | 0.5–1.5 (0.5) | Se |
| First cladding layer (103) | 0.28–0.60 (0.31) | 0.5–1.5 (1.0) | Se |
| First optical waveguide layer (104) | 0.15–0.30 (0.20) | 0.1–0.2 (0.15) | none |
| Active layer (105) | — | 0.043–0.098 (0.075) | — |
| Well layer (105a) | 0 | 0.007–0.012 (0.010) | none |
| Barrier layer (105b) | 0.15–0.25 (0.20) | 0.003–0.010 (0.007) | none |
| Second optical waveguide layer | 0.15–0.30 (0.20) | 0.2–0.6 (0.55) | Zn |

TABLE 1-continued

| | Al Composition | Film Thickness (μm) | Dopant |
|---|---|---|---|
| (106) Second cladding layer (107) | 0.28–0.60 (0.31) | 0.5–1.5 (1.0) | Zn |
| Contact layer (108) | 0 | 0.2–0.8 (0.6) | Zn |

On the contact layer 108 is formed a current constriction layer 109 having a stripe-shaped opening portion, that is, an opening portion for configuring a current injection region 112. A p-side electrode 110 is formed on the surface and the opening portion of the current constriction layer 109 and an n-side electrode 111 is formed on the under surface of the substrate 101. A first reflective layer 120 formed of an anti-reflective film (AR film) is provided on an edge surface of a main-beam side of the resultant assembly, and a second reflective layer 121 formed of a highly reflective film (HR film) is formed on a monitor-beam side thereof.

Figure 2:
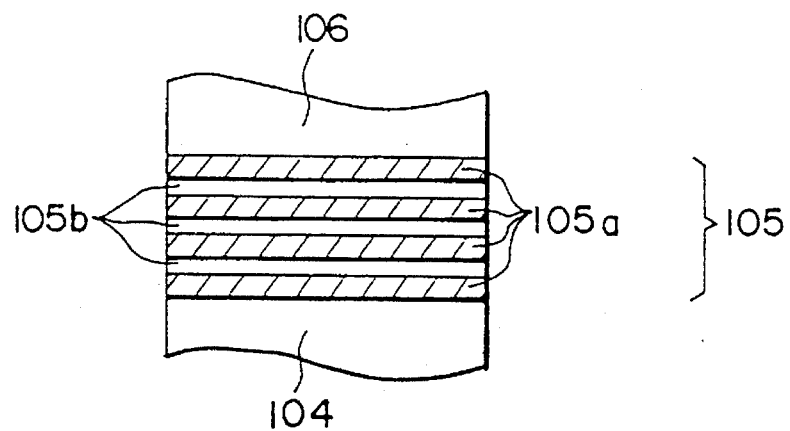
FIG. 2 is a schematic partially enlarged sectional view of an active layer of the semiconductor laser of FIG. 1.

The active layer 105 has a multi-quantum-well structure with a plurality of well layers, as shown in FIG. 2.

This multi-quantum-well structure could have, for example, four well layers 105a and three barrier layers 105b, deposited alternately.

When AlGaAs compound semiconductors are used as the semiconductor layers, the lasing wavelength of the resultant semiconductor laser would ordinarily be in the vicinity of 870 nm. However, since a quantum-well structure employed as the active layer, which shifts lasing wavelength toward a shorter wavelength, a AlGaAs semiconductor laser having a quantum-well structure has a lasing wavelength that is usually shorter than 830 nm.

The present invention shows a quantum-well semiconductor laser that is effective for lasing at a longer wavelength of at least 850 nm by regulating the semiconductor layers, particularly of the flatness of the active layer, and the composition of the cladding layers.

Figure 3:
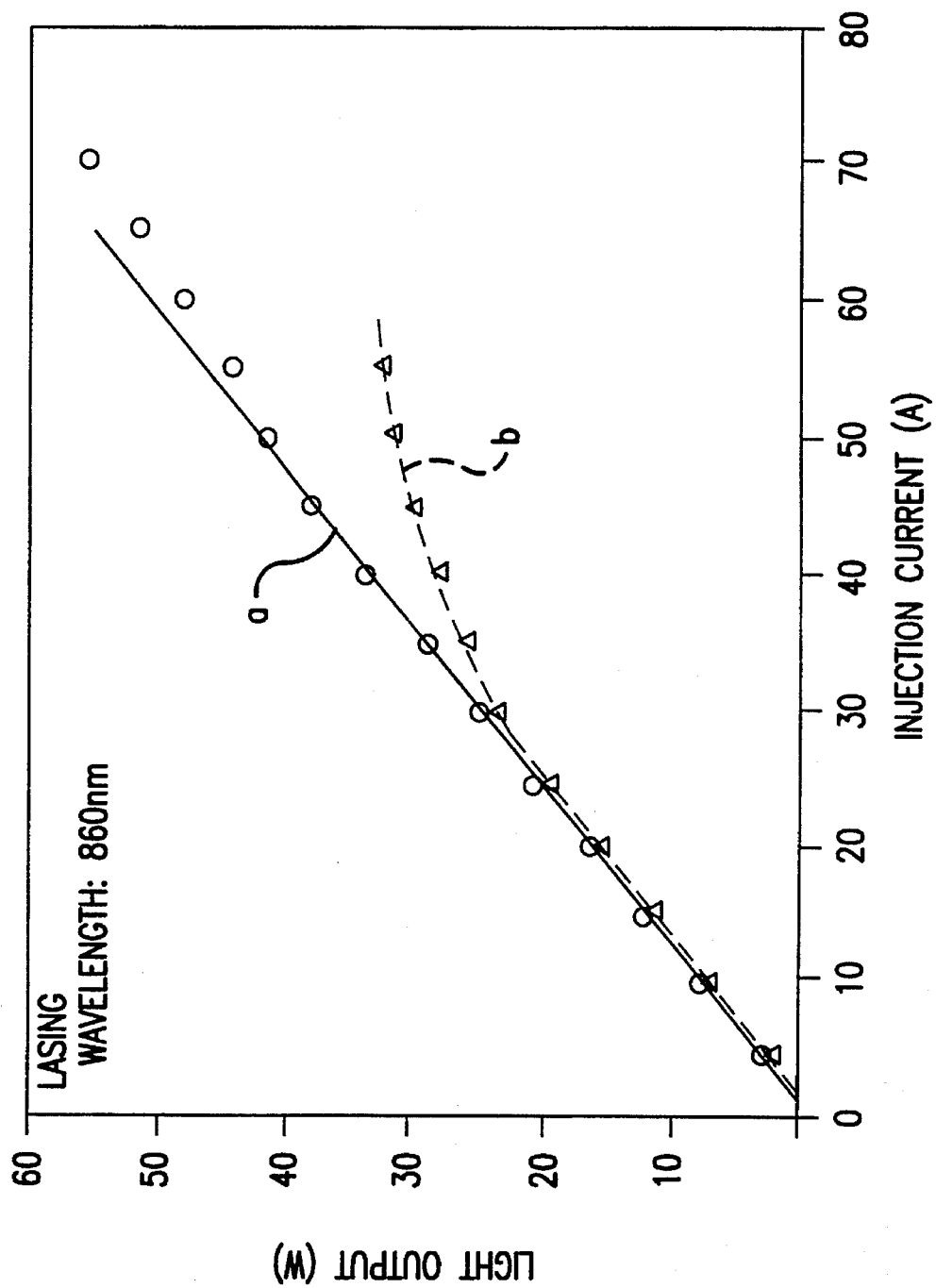
FIG. 3 is a graph comparing the I-L characteristics of the semiconductor laser of the first embodiment of the present invention and a comparative semiconductor laser.

The relationship between the composition of the cladding layers and the characteristics of the resultant semiconductor laser will first be described. FIG. 3 illustrates the injection current-light output characteristic (I-L characteristic) of a sample of this embodiment (a) and that of a sample with cladding layers of a different Al composition (b) created for comparison. The structure of this comparative sample (b) is equivalent to that of the sample of this embodiment (a), except that the Al composition (the value of x in $Al_xGa_{1-x}As$) of both the first cladding layer and the second cladding layer is 0.22.

From contrast of the experimental results shown in FIG. 3, it is apparent that no great difference exists between the two I-L characteristics when the injection current is low. However, when the injection current exceeds 20 A, it is clear that the light output of the laser of the comparative sample drops dramatically.

Figure 4:
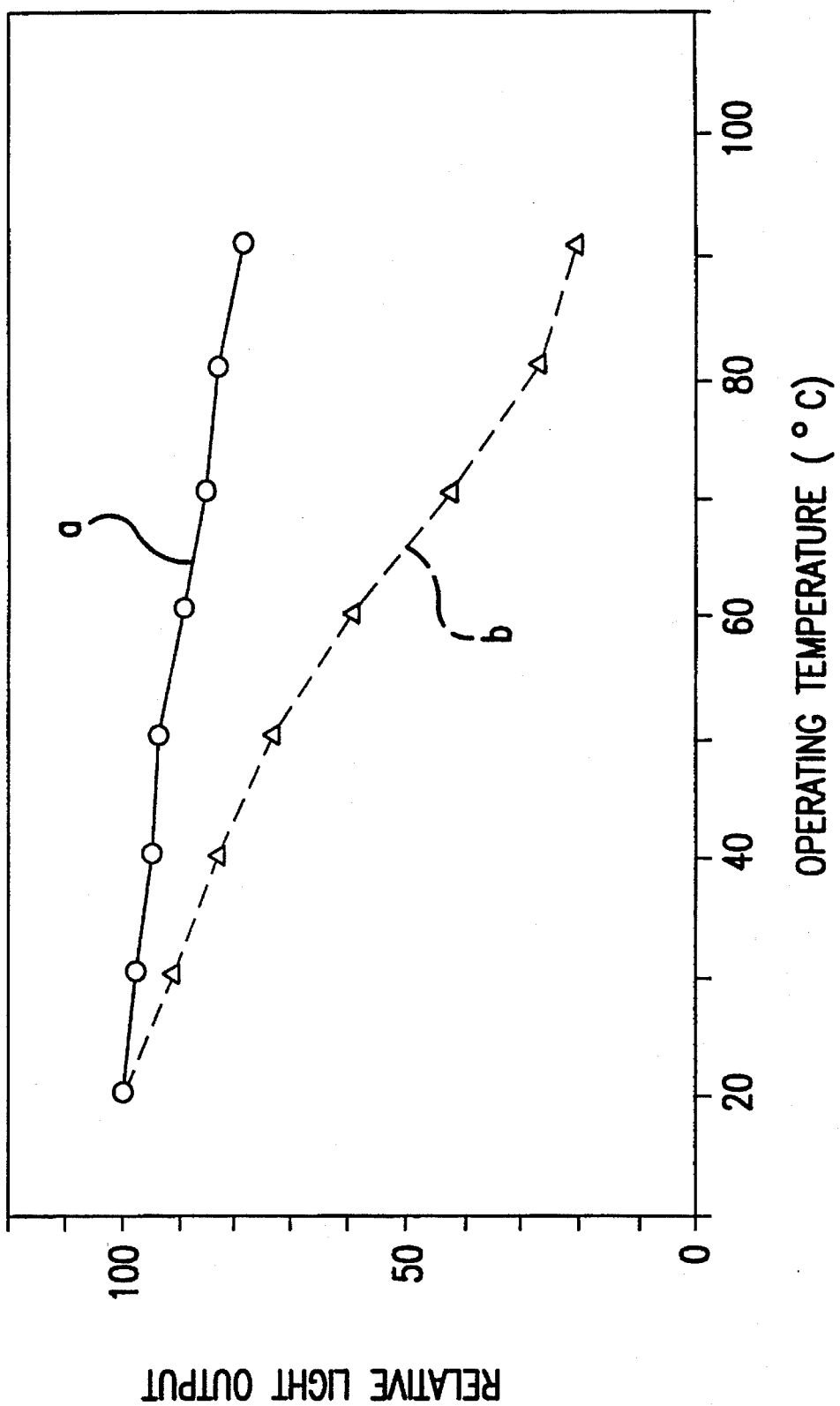
FIG. 4 is a graph showing the dependency on temperature of the light outputs achieved by the semiconductor laser of the first embodiment of the present invention and the comparative semiconductor laser.

The difference between the two semiconductor lasers becomes obvious when their temperature characteristics are contrasted. FIG. 4 is a graph illustrating the temperature characteristics. This graph plots light output over a temperature range of 20° C. to 90° C. while the same current is injected, and shows that the light output is dependent on temperature. The injection current in this experiment is 30 A.

According to FIG. 4, if the light output at 90° C. is assumed to be ΔT, when the light output at 20° C. is taken to be 100, the sample of this embodiment (a) has a ΔT of 80 while that of the comparative example (b) has a ΔT of 20. It is thus clear that the light output of the semiconductor laser of this embodiment is far less dependent on the operating temperature than the laser of the comparative example.

Accordingly, since the Al composition of the cladding layers of the laser of the comparative example is as low as 0.22, the injected carriers overflow from the active region when the injection current is high, or when the temperature of junction portions is high, and thus the efficiency drops. Calculations show that the difference between the energy gap of the active layer and that of each cladding layer in the laser of the comparative example is only about 0.23 eV. Research conducted by the inventors has proved that if such energy gap difference between the active layer and each cladding layer is greater than 0.35 eV, favorable light-emitting efficiency and temperature characteristics can be obtained. Thus it is preferable that the Al composition of the cladding layers of the quantum-well semiconductor laser of this embodiment is to be greater than 0.28.

Further, the active layer 105 has flatness of such a degree that roughness is no more than ±0.1 μm with respect to a reference surface within a unit area of 1 mm×1 mm.

In the sample of this embodiment, the roughness (degree of flatness) of the surfaces of the active layer obtained by a contact-type film roughness meter is within ±0.05 μm.

The width of the current injection region of the current constriction layer 109 (shown as W in FIG. 1) is between 100 μm to 250 μm, preferably 150 μm to 200 μm. If the width of the current injection region is less than 100 μm, the injection current density increases and thus it is difficult to achieve increased light output. If this width exceeds 250 μm, on the other hand, the light intensity distribution at the laser-emitting edge surface becomes uneven, and the radiated beam does not have a single peak pattern.

Figure 5:
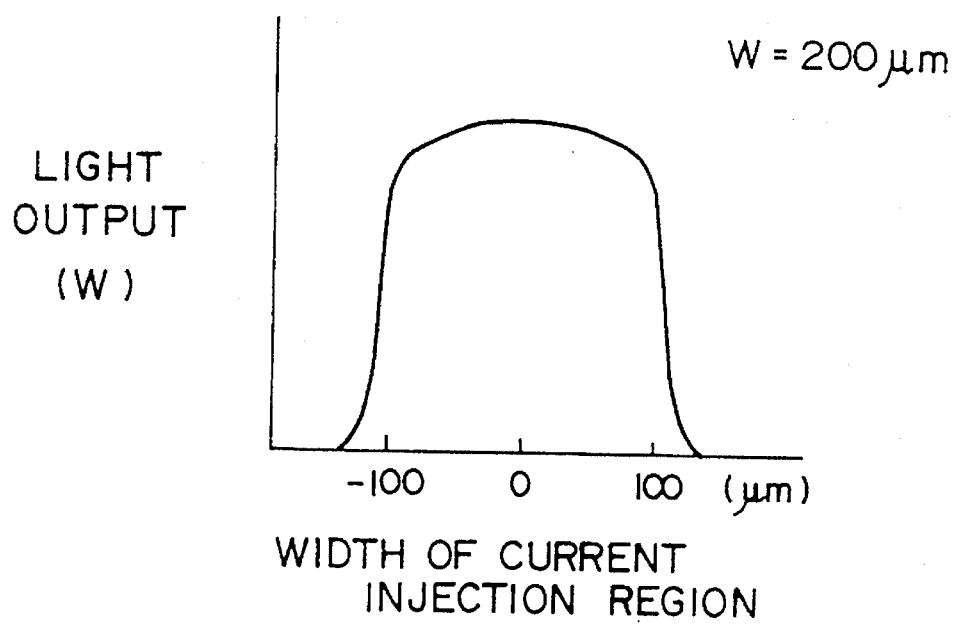
FIG. 5 is a graph showing the relationship between width of a current injection region and light output obtained for the semiconductor laser of the first embodiment of the present invention.
Figure 6:
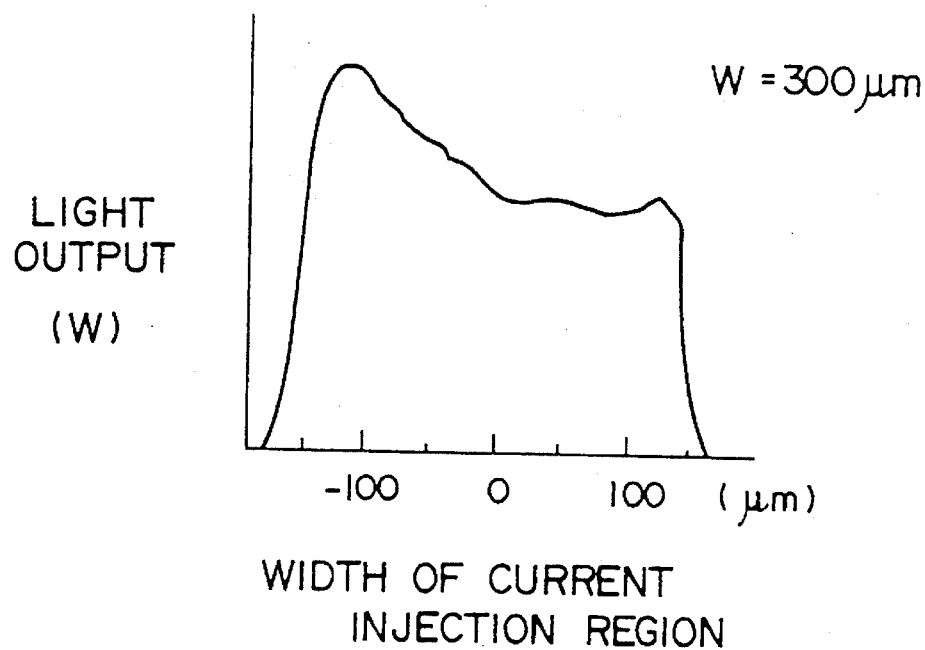
FIG. 6 is a graph showing the relationship between width of a current injection region and light output obtained for the comparative semiconductor laser.

Experimental results supporting the foregoing are shown in FIGS. 5 and 6. In each of FIGS. 5 and 6, the width W of the current injection region is plotted along the axis of abscissa and the light output along the axis of ordinate. FIG. 5 shows the light intensity distribution when the width W is 200 μm and FIG. 6 shows the light intensity distribution when the width W is 300 μm which exceeds the range of the present invention. From FIG. 5 it is clear that a substantially uniform light output is obtained over the entire width when the width of the injection current region is 200 μm, and thus lasing in a favorable horizontal mode is obtained with a single peak pattern. In contrast, FIG. 6 shows that a uniform light intensity distribution cannot be obtained when the width of the current injection region is 300 μm.

The semiconductor laser 100 of this embodiment has a resonator length (shown as L in FIG. 1) that is between 500 μm to 1,000 μm, preferably 600 μm to 900 μm. If the resonator length L is less than 500 μm, the injection current density increases and the light output drops. On the other hand, if the resonator length L exceeds 1,000 μm, the current at the start of lasing increases and the driving current required for achieving the predetermined light output also increases, and thus it is difficult to create the drive circuit.

Figure 7:
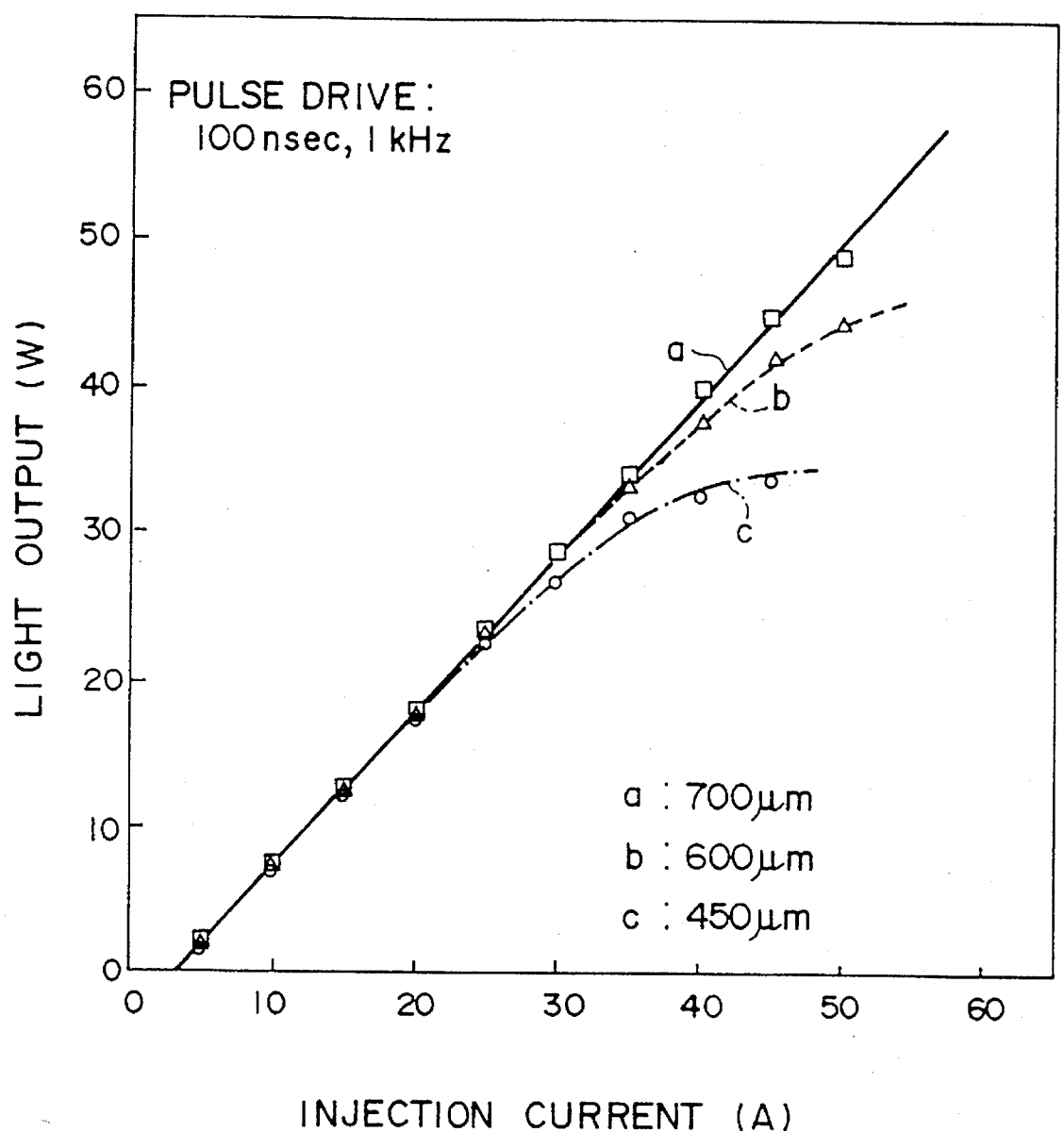
FIG. 7 is a graph showing the relationship between I-L characteristic and resonator length, with I-L characteristic curves obtained for the semiconductor laser of the first embodiment of the present invention and the comparative semiconductor laser.

An I-L characteristic used to prove the foregoing is shown in FIG. 7, where injection current is plotted along the axis of abscissa and light output along the axis of ordinate. Three different resonator lengths L were examined in these experiments. Lines a, b, and c indicate the I-L characteristics obtained when L is 700 μm, 600 μm and 450 μm, respectively.

FIG. 7 shows that a good linear relationship is obtained for the I-L characteristic when the resonator length is 700

μm, and thus high light output is obtained even when large current is injected. When the resonator length is 600 μm, the light output drops slightly in the high current injection region; such a drop affects little the practical use of the laser. However, it is clear that when the resonator length is 450 μm and falls outside the range of the present invention, the light output in the high current injection region decreases dramatically, making the laser unsuitable for practical use.

The reflectivity of the first reflective layer 120 is preferably between 0.1% to 5%. tf the reflectivity is less than 0.1%, the lasing threshold cannot be passed. If the reflectivity exceeds 5%, the external differential quantum efficiency drops, and therefore it is impossible to obtain high light output. The reflectivity of the second reflective layer 121 is preferably at least 98.5%. If the reflectivity is less than 98.5%, the lasing threshold current rises, and therefore it is impossible to obtain high light output.

The reflectivity of the first reflective layer 120 may be decreased by a single-layer coating of a dielectric film having a thickness of λ/nd (λ:lasing wavelength, n: refractive index of dielectric), or of a double-layer coating of a combination of two dielectric films with different refractive indices. In the latter case, it is necessary to deposit the two dielectric films in such a manner that the dielectric film with the larger refractive index is on the inner side, that is, on the edge surface of the semiconductor layers, and the dielectric film with the smaller refractive index is on the outer side thereof. Dielectric materials used to configure the first reflective layer 120, film thicknesses, numbers of films (or numbers of pairs of films), and reflectivities are listed in Table 2. Table 2 shows that many of the reflective layers formed of combinations of dielectric films of different refractive indices, deposited in pairs of layers, have much smaller reflectivities than reflective layers formed of single layers of dielectric film.

TABLE 2

| Thin Dielectric Films (First Film/Second Film) | Film Thickness (nm) | Number of Films/Pairs | Reflectivity (Measured %) |
|---|---|---|---|
| $Al_2O_3$ | 139.4 | 1 Film | 3 |
| MgO | 126.5 | 1 Film | 2 |
| ZrTiOx | 107.5 | 1 Film | 1 |
| $Ta_2O_5$ | 97.7 | 1 Film | 3 |
| SiNx | 107.5 | 1 Film | 1.5 |
| TiOx | 93.5 | 1 Film | 4 |
| ZrOx/SiOx | 107.5/ 148.3 | 2 Pairs | 0.2 |
| SiNx/SiOx | 107.5/ 148.3 | 2 Pairs | 0.5 |
| $Ta_2O_5$/SiOx | 97.7/ 148.3 | 2 Pairs | 4 |
| $Ta_2O_5/Al_2O_3$ | 97.7/ 143.3 | 2 Pairs | 0.5 |
| TiOx/$Al_2O_3$ | 93.5/ 143.3 | 2 Pairs | 2 |

The second reflective layer 121 is formed of dielectric films of different refractive indices deposited alternately, and each dielectric film has film thickness of λ/4n. In this case, in contrast to the first reflective layer 120, the dielectric film with the smaller refractive index should be formed closer to the semiconductor layer side than the dielectric film with the larger refractive index. The dielectric materials, film thicknesses, numbers of pairs, and reflectivities of dielectric films used to configure the second reflective layer 121 are listed in Table 3. Table 3 shows that most of these reflective layers have high reflectivities of at least 99%.

TABLE 3

| Thin Dielectric Films (First Film/Second Film) | Film Thickness (nm) | Number of Pairs | Reflectivity (Measured %) |
|---|---|---|---|
| SiOx/ZrOx | 148.3/ 107.5 | 9 | 99.4 |
| SiOx/ZrTiOx | 148.3/ 107.5 | 9 | 99.4 |
| SiOx/$Ta_2O_5$ | 148.3/ 97.7 | 7 | 99.6 |
| SiOx/TiOx | 148.3/ 93.8 | 7 | 99.7 |
| SiOx/a-Si | 148.3/ 63.2 | 4 | 98.7 |
| SiOx/SiNx | 148.3/ 107.5 | 9 | 98.2 |
| $Al_2O_3/Ta_2O_5$ | 134.4/ 97.7 | 8 | 99.2 |

An example of the method of fabricating the semiconductor laser of this embodiment will now be described.

AlGaAs-type semiconductor layers comprising the n-type buffer layer 102, n-type first cladding layer 103, n-type first optical waveguide layer 104, active layer 105, p-type second optical waveguide layer 106, p-type second cladding layer 107, and p-type contact layer 108 are grown epitaxially in sequence on the n-type GaAs substrate 101 by metal-organic chemical vapor deposition (MOCVD). The film-formation conditions could be, for example, a growth temperature of 680° to 800° C., a growth pressure of 50 to 200 Torr(26,660 Pa), an organic metal such as trimethyl gallium (TMGa) or trimethyl aluminum (TMAl) used as a Group-III element, a hydride such as arsine ($AsH_3$) used as a Group-V element, $H_2Se$ used as an n-type dopant, and dimethyl zinc (DEZn) used as a p-type dopant.

The conditions governing the Al composition, film thickness, and dopant of each of the various layers configuring the AlGaAs-type semiconductor layers are as laid out in Table 1.

In this oase, the n-type substrate 101 is a flat substrate that does not have roughness that exceeds ±0.05 μm within a unit area of 1 mm×1 mm. The roughness means the height or depth of any convex and concave portions with respect to a plane which is above the substrate 101 and whose height corresponds to the average thickness in a unit area of the substrate 101. Before the semiconductor layers are formed, it is preferable that the surface of the substrate is washed without deteriorating the flatness thereof, by etching while agitating the substrate sufficiently in an etchant of $H_2SO_4$, $H_2O_2$, and $H_2O$ in the ratios of 5:1:1. It is possible to restrict the roughness of the semiconductor layers to be no more than ±0.02 μm within a unit area of 1 mm×1 mm by modulating the gas flow rate during the MOCVD in an optimal manner. Thus the roughness of the entire substrate and the semiconductor layers below the active layer can be limited so as to be no more than ±0.07 μm. Research conducted by the inventors has proved that the roughness of the active layer 105 can be held down to no more than ±0.1 μm by restricting the roughness of the semiconductor layers below the active layer to be less than ±0.05 μm.

After the AlGaAs-type semiconductor layers have been grown, an insulating film is deposited by chemical vapor deposition (CVD) on the contact layer 108. In this embodiment, $SiO_2$ is used as the insulating film. This insulating film is patterned by popular photolithography and etching techniques to form the current constriction layer 109 having the stripe-shaped current injection region 112 in the central portion thereof.

The n-side ohmic electrode 111 and p-side ohmic electrode 110 are then vapor deposited on the other surface of the substrate 101 and the surface of the current constriction layer 109 and of the current injection region 112 respectively. Subsequently, alloying is performed for 30 to 120 seconds at, for example, 350° to 450° C. in nitrogen atmosphere.

The dielectric films forming the first reflective layer 120 and second reflective layer 121 are then formed by electron beam deposition. In other words, wafers that have been achieved through the foregoing process and cleaved into bar form are first accumulated in such a manner that dielectric films can be formed only on the cleavage planes, which are edge surfaces of the semiconductor lasers. This stack is placed in a vapor deposition chamber which is evacuated to such a degree that the vacuum is less than $5\times10^{-6}$ Torr($6.67\times 10^{-4}$ Pa), and the bar-shaped wafers are heated to a temperature of 100° to 250° C. The electron-beam current is adjusted so that the rate of deposition is between 0.1 to 1 nm/second to form the dielectric layers.

The semiconductor laser 100 obtained in the foregoing manner is a gain-waveguide type of semiconductor laser having a configuration with a single wide stripe. The semiconductor laser of this embodiment has structural features such as an active layer of a multiple quantum-well structure with a good flatness, cladding layers with Al compositions set within a specific range, a large resonator length of 500 to 1,000 μm, and a wide current injection region of 100 to 250 μm. Further, the semiconductor laser 100 is capable of lasing with a single peak pattern at a wavelength of 860 nm and at a maximum light output of 50 W, while maintaining a wide lasing region of approximately 100 to 250 μm.

Second Embodiment

Figure 8:
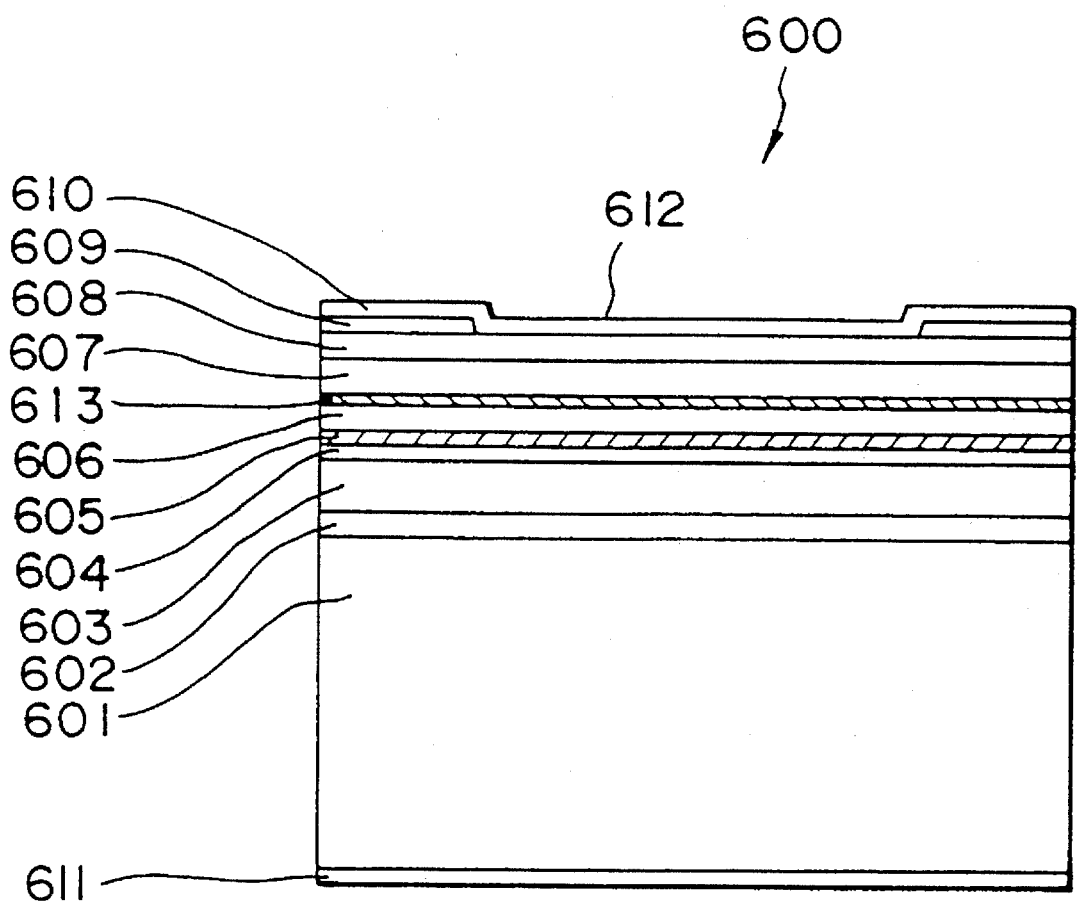
FIG. 8 is a schematic cross sectional view of a semiconductor laser of a second embodiment of the present invention.

FIG. 8 is a cross sectional view diagrammatically showing a semiconductor laser of a second embodiment of the present invention.

A semiconductor laser 600 of this embodiment differs from the above described semiconductor laser 100 of the first embodiment in the two points discussed below. First, a blocking layer 613 is interposed between a second optical waveguide layer 606 and a second cladding layer 607 in order to prevent any overflow of carriers. Secondly, the Al composition of cladding layers 603 and 607 is as low as 0.20 to 0.40. The rest of the structure, that is, a GaAs substrate 601, a buffer layer 602, a first optical waveguide layer 604, an active layer 605, a second optical waveguide layer 606, a contact layer 608, a current constriction layer 609, electrodes 610 and 611, and reflective layers (not shown in the figure) are basically the same as those in the semiconductor laser 100 of the first embodiment, therefore detailed description thereof is omitted. Details of the Al composition, film thickness, and dopant of each of the semiconductor layers of the semiconductor laser 600 of this embodiment are given in Table 4.

TABLE 4

| | Al Composition | Film Thickness (μm) | Dopant |
|---|---|---|---|
| Buffer layer (602) | 0 | 0.5–1.5 (0.5) | Se |
| First cladding layer (603) | 0.20–0.40 (0.25) | 0.5–1.5 (1.0) | Se |
| First optical waveguide layer (604) | 0.15–0.30 (0.20) | 0.1–0.2 (0.15) | none |
| Active layer (605) | — | 0.043–0.098 (0.075) | — |
| Well layer (605a) | 0 | 0.007–0.012 (0.010) | none |
| Barrier layer (605b) | 0.15–0.25 (0.20) | 0.003–0.010 (0.007) | none |
| Second optical waveguide layer (606) | 0.15–0.30 (0.20) | 0.2–0.6 (0.55) | Zn |
| Blocking layer (613) | 0.30–0.60 (0.40) | 0.008–0.020 (0.010) | Zn |
| Second cladding layer (607) | 0.20–0.40 (0.25) | 0.5–1.5 (1.0) | Zn |
| Contact layer (608) | 0 | 0.2–0.8 (0.6) | Zn |

In the semiconductor laser 600 of this embodiment, the formation of the blocking layer 613 prevents injected carriers from overflowing without having to increase the Al composition of the cladding layers 603 and 607. In other words, the overflow of injected carriers is prevented in the first embodiment by setting the Al composition of the cladding layers 103 and 107 to fall within a comparatively large specific range. However, increasing the Al composition of the cladding layers raises the optical confinement factor, and leads to two areas to be considered. First, the far-field pattern in the direction perpendicular to the junction direction of the semiconductor layers increases, and thus the ellipticity of the far-field pattern also increases, making it rather difficult to design an optical system using this laser as a light-emitting element. The other area is that the light density increases in the light-emitting region in the vicinity of the edge surface, so that the edge surface is susceptible to damage. This second embodiment enables the same good optical lasing as the first embodiment by increasing the Al composition of the cladding layer.

The film thickness of the blocking layer 613 is preferably between 8 to 20 nm, more preferably 10 to 15 nm, and the Al composition ratio (x) thereof is preferably between 0.30 to 0.60, more preferably 0.35 to 0.5.

Figure 9:
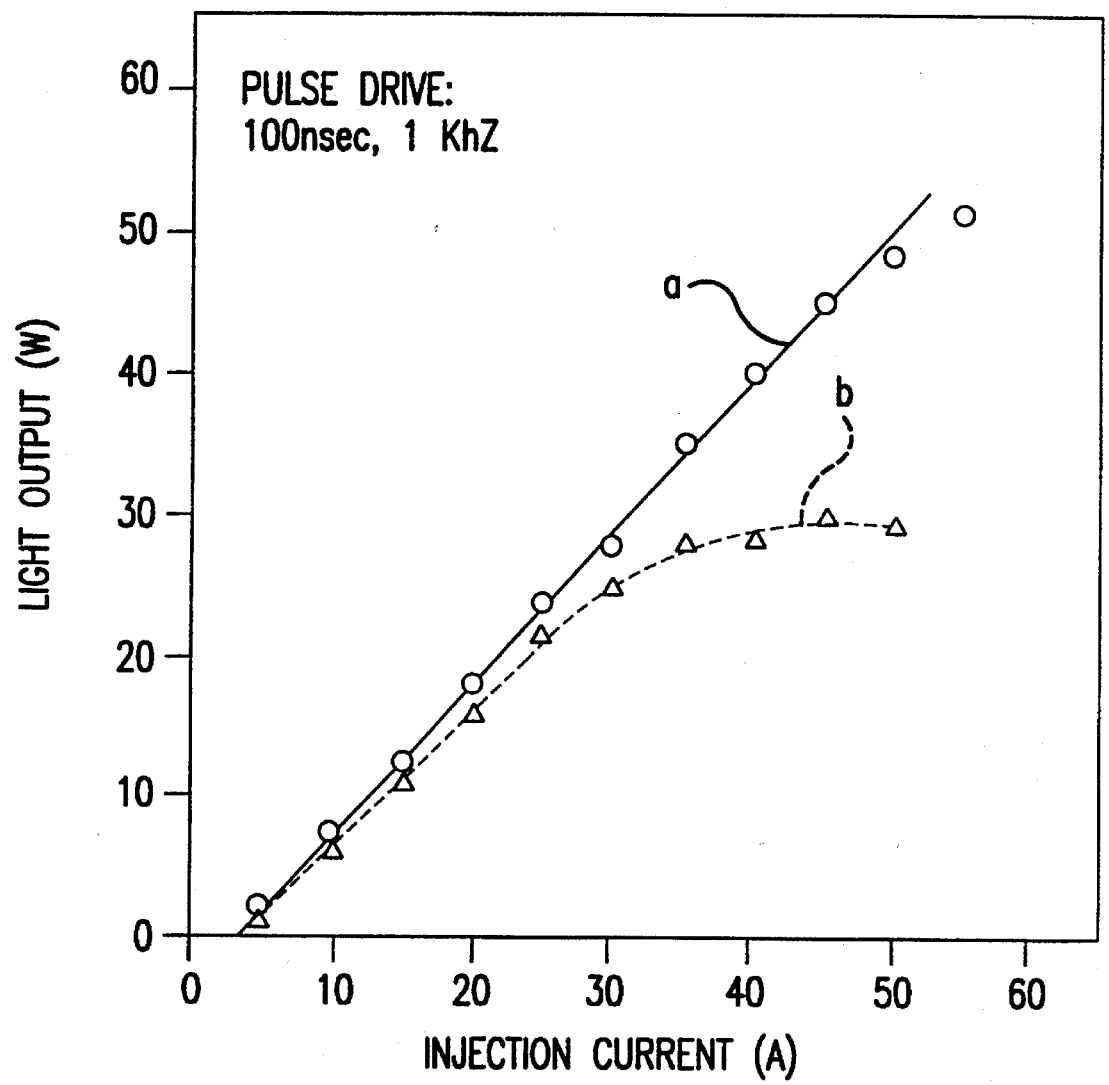
FIG. 9 shows I-L characteristic curves obtained for the semiconductor laser of the second embodiment of the present invention and a comparative semiconductor laser.

Results obtained by examining characteristics by using the semiconductor laser of this embodiment will next be described. A semiconductor laser of the configuration given in parentheses in the fields of Table 4 was used as a sample in this experiment. FIG. 9 illustrates the I-L characteristic.

The line a in FIG. 9 is the I-L characteristic obtained for the semiconductor laser of this embodiment having a blocking layer; the line b is that obtained for a comparative semiconductor laser which does not have a blocking layer and whose layers are of the same configurations as the layers of the semiconductor laser of this embodiment. FIG. 9 shows that linearity is maintained when there is a blocking layer even if the injection current is high, and that light output saturates when there is no blocking layer.

Temperature characteristics measured in the same manner as described above for the first embodiment produces the following result. If the light output at 90° C. is assumed to be ΔT, when the light output at 20° C. is taken to be 100, the sample of this embodiment has a ΔT of 70. As it is clear from the result obtained for the comparative sample shown by the line b of FIG. 4, since the value of ΔT when there is no blocking layer is 20, the interposition of the blocking layer 613 greatly improves the temperature characteristic of the semiconductor laser.

The far-field pattern of the sample is 24° which the is same as when the blocking layer is not interposed. The semiconductor laser of this embodiment has these favorable light emission characteristics, because the blocking layer 613 is so thin that it has no effect on the light in waveguide mode and prevents any overflow of injected carriers from the active region.

The above embodiment concerned an example in which the blocking layer 613 is interposed between the second optical waveguide layer 606 and the second cladding layer 607, but the present invention is not limited thereto. The blocking layer can be interposed between the first cladding layer 603 and the first optical waveguide layer 604, or between the first cladding layer 603 and the first optical waveguide layer 604, and between the second cladding layer 607 and the second optical waveguide layer 606.

The semiconductor laser of the present invention is not limited to the semiconductor lasers described in the first and second embodiments, and is applicable to other semiconductor lasers of a stripe structure such as planar stripe type and proton-bombered type.

Third Embodiment

Figure 10:
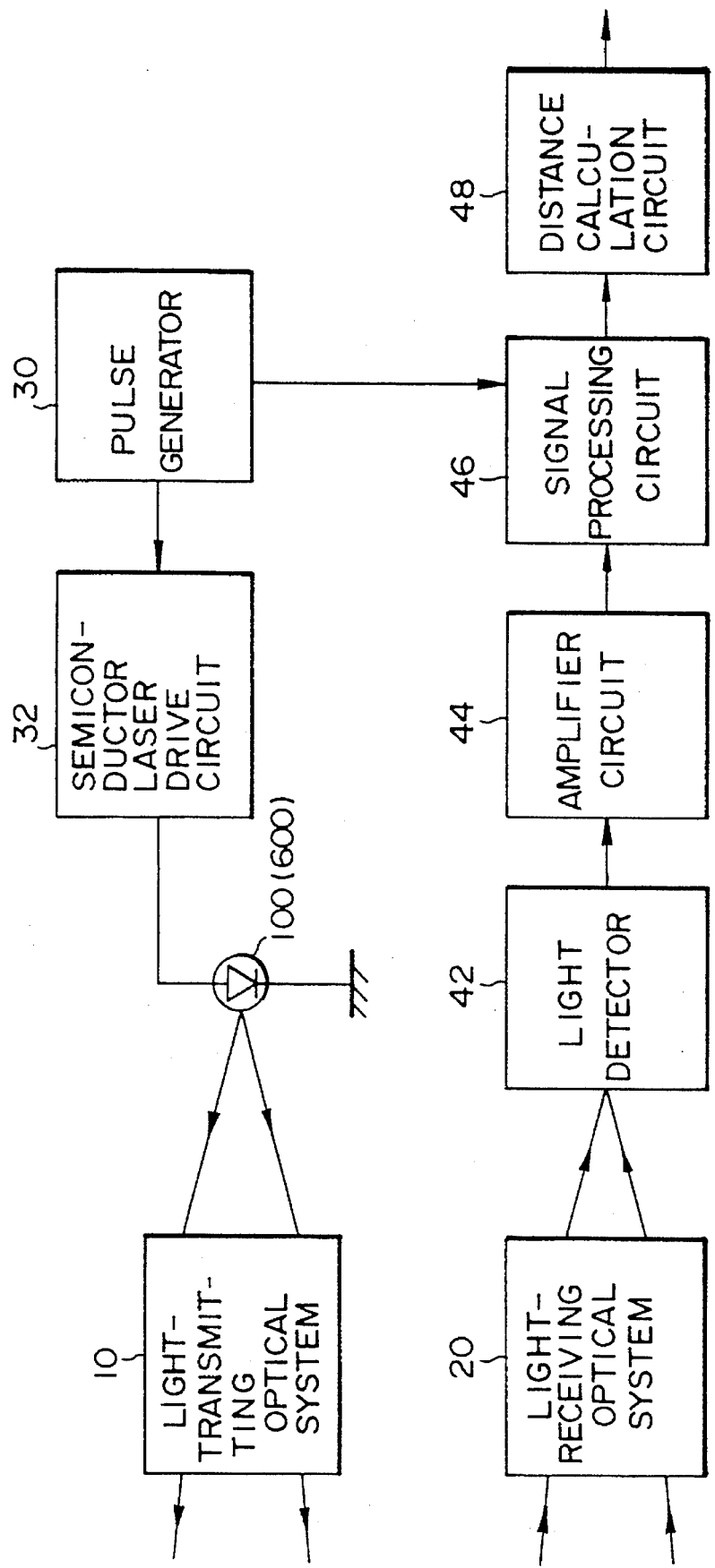
FIG. 10 is a block diagram of a light-sensing device of a third embodiment of the present invention.

A block diagram of an example of a light-sensing device using the semiconductor laser of the present invention is shown in FIG. 10. While the following discussion refers to the semiconductor laser 100 of the first embodiment, it applies the semiconductor laser 600 of the second embodiment in the same way. This light-sensing device is used as range-finding radar for measuring the distance to a target.

This light-sensing device comprises a pulse generator 30 that repeatedly outputs laser-driving pulses. The pulses output from the pulse generator 30 are input to a semiconductor laser drive circuit 32 and a signal processing circuit 46.

The semiconductor laser drive circuit 32 drives the semiconductor laser 100 every time a driving pulse is input, and thus measurement light is output from the semiconductor laser 100. The light that is output from the semiconductor laser 100 is output as laser light for measuring, directed forward into space, through a light-transmitting optical system 10.

This measurement laser light hits an object to be inspected, light scattered or reflected therefrom is detected by a light detector 42 via a light-receiving optical system 20, and this light is converted into an electrical signal and is input to the signal processing circuit 46 via an amplifier circuit 44. The signal processing circuit 46 measures the time taken for the laser light to travel from the light-transmitting side to the light-receiving side, performs spectroscopy on the object to be inspected, then outputs these measurement results toward a distance calculation circuit 48. Note that ordinary components used in range-finding radar systems can be used as components such as the light-receiving optical system 20 and the light detector 42.

Figure 11:
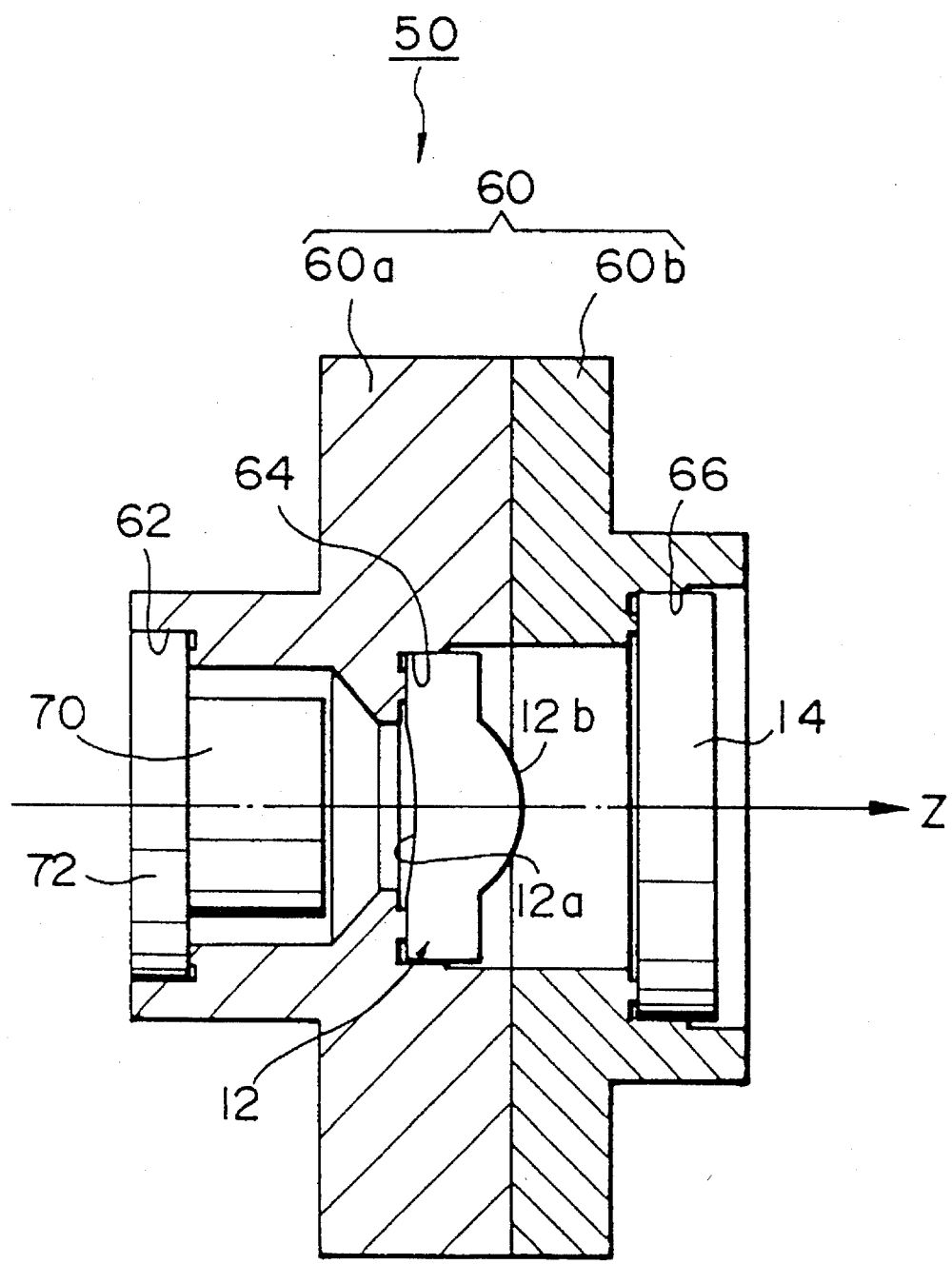
FIG. 11 is a partial cross sectional view showing the configuration of a light-transmitting portion of the third embodiment of the present invention.

FIG. 11 is a partial cross sectional view illustrating a light-transmitting portion 50 in which a toric lens 12 and diffraction grating 14 are mounted as the light-transmitting optical system 10.

A holder 60 of the light-transmitting portion 50 has a configuration such that a cylindrical portion the thereof is split into a first holder portion 60a and a second holder portion 60b that are connected together in the axial direction. The first holder portion 60a has a cylindrical portion that protrudes outward in the axial direction, and a step-shaped first support portion 62 is formed in a cylindrical end portion thereof, for holding an installation portion 72 of a laser package 70. A step-shaped second support portion 64 is formed in substantially the center of the first holder portion 60a for holding the toric lens 12 that has a rectangular outer profile. A cylindrical portion is formed protruding outward in the axial direction from the second holder portion 60b, and a step-shaped third support portion 66 is formed within the cylindrical portion for holding the diffraction grating 14.

The laser package 70, toric lens 12, and diffraction grating 14 are fixed to the corresponding first support portion 62, second support portion 64, and third support portion 66 by, for example, a light-hardening adhesive. Screws or means of applying local pressure to the part of holders to deform them plastically could also be used as the support means.

Since the holder 60 of this embodiment is divided into the first holder portion 60a and second holder portion 60b, the second holder portion 60b can be fixed to the first holder portion 60a by means such as screws after the toric lens 12 has been positioned in the second support portion 64, and thus the toric lens 12 can be positioned accurately and simply.

The toric lens 12 has two lens surfaces that differ with respect to an optical axis Z. A first lens surface 12a on the laser package 70 side has a toric surface and a second lens surface 12b on the diffraction grating 14 side has an aspheric surface that is rotationally symmetrical about the Z axis. These lens surfaces will be described later in more detail.

Glass or a thermoplastic resin such as polymethyl methacrylate (PMMA), a styrene acrylonitrile (SAN) copolymer, polystyrene, or a polycarbonate could be used as the material of the toric lens 12, and PMMA or a polycarbonate would be particularly suitable therefor. The two surfaces of the toric lens 12 are preferably provided with an anti-reflective film formed of MgF or a dielectric multi-layer film. In this embodiment, the reflectivity of this anti-reflective film is set to be approximately 3%.

Figure 12:
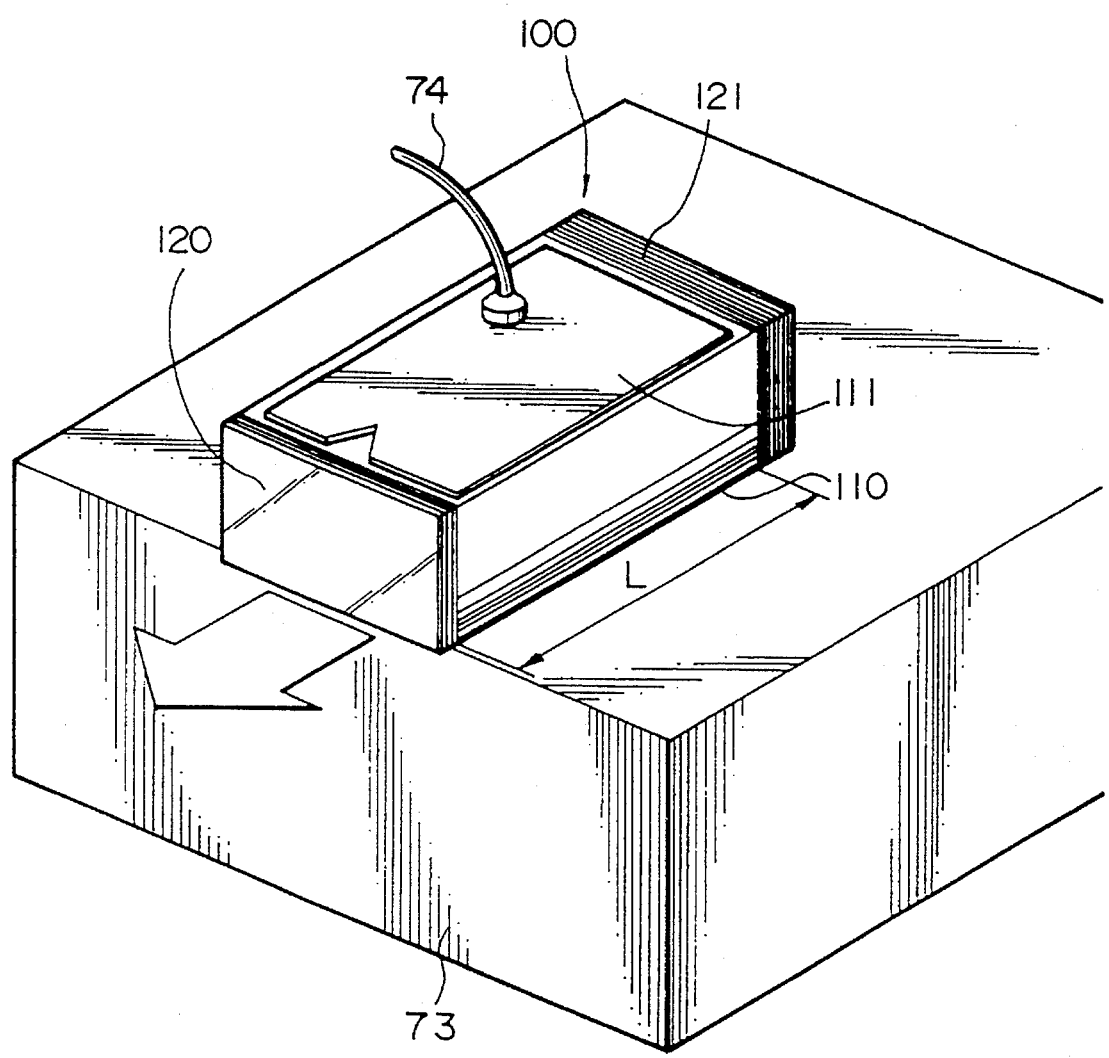
FIG. 12 is a perspective view of the light-transmitting portion of the third embodiment of the present invention with the semiconductor laser in a mounted state.

FIG. 12 is a schematic perspective view illustrating the semiconductor laser 100 (laser chip) mounted within the laser package 70. In this example, a support body 73 of a material such as aluminum nitride (AlN) or silicon is provided between the semiconductor laser 100 and a heat sink (not shown) made of a metal such as copper. A support body of aluminum nitride is particularly preferable. Since aluminum nitride has a high level of thermal conductivity and a coefficient of thermal expansion is similar to that of the AlGaAs-type compounds of the semiconductor laser 100, it acts to ensure there are no residual stresses in the active layer of the laser after the laser chip is soldered at a temperature of 250° to 350° C. using an alloy of gold and tin (Au/Sn). The high level of thermal conductivity of the aluminum nitride also has the effect of allowing the heat generated by the active layer to escape, thus increasing the life of the laser.

The thickness of this support body 73 is preferably between approximately 150 μm to 190 μm. This is because calculation of the residual stresses generated in the active layer of the laser relative to the coefficients of thermal expansion of the laser chip, the copper, and the AlN has found that tensile and compression stresses could be generated relative to the thickness of the support body, but at such a thickness the residual stresses are extremely small.

Figure 13A:
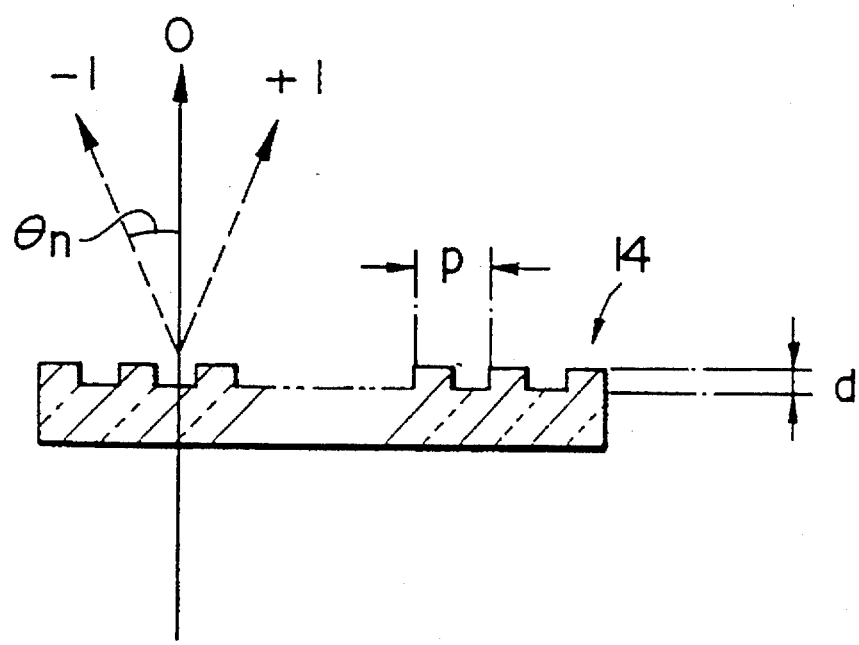
FIGS. 13A and 13B are a cross sectional view and plan view of diffraction grating shown in FIG. 11.
Figure 13B:
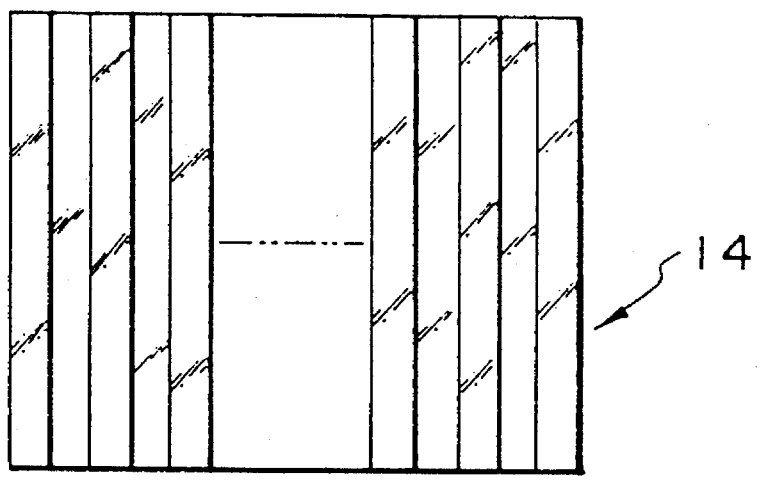

An example of the diffraction grating 14 is shown in FIG. 13A and FIG. 13B, where FIG. 13A is a cross sectional view and FIG. 13B is a plan view.

The diffraction grating of FIG. 13A and FIG. 13B is a simple grating having linear grating grooves. In general, light passing through a diffraction grating of this type is divided into zero-order diffracted light that passes straight through without being diffracted and nth-order diffracted light (where n is an integer) that passes through at an angle of diffraction θn. With the diffraction grating of the present invention, the zero-order diffracted light is used as a main beam and the positive/negative first-order diffracted light is used as sub-beams. The higher-order light is of a low intensity, so it does not contribute to the measurement.

Strictly speaking, the light entering the diffraction grating is not limited to being incident perpendicular thereto, but if the light is considered to be incident substantially perpendicular to the grating, to simplify the explanation, the relationship between the angle of diffraction θ of the positive/negative first-order diffracted light, the wavelength λ of the light source, and the pitch p of the diffraction grating is given by:

$$\sin\theta = \lambda/p$$

The ratio of the amounts of zero-order diffracted light and first-order diffracted light depends on the depth d of the grating grooves. If the ratio of ridges and grooves of the diffraction grating is 1:1 (a "duty ratio" of 1 in 2), the intensities $\eta_0$ and $\eta_1$ of the zero-order diffracted light and positive/negative first-order diffracted light are given by:

$$\eta_0 = \cos^2(\pi d\Delta n/\lambda)$$

$$\eta_1 = (2/\pi)^2 \sin^2(\pi d\Delta n/\lambda)$$

Note that an $\Delta n = n - 1$, where n is the refractive index of the diffraction grating material. It is clear from these equations that, if the wavelength λ of the light source and the refractive index n of the diffraction grating material are constant, the intensity ratio between the zero-order diffracted light and positive/negative first-order diffracted light can be freely selected by adjusting the depth d of the grooves in the diffraction grating. The angle of illumination of the beam can also be set selectively by changing the grating pitch p or by changing the positional relationships of the light source, diffraction grating, and projection lens.

Figure 14A:
FIGS. 14A and 14B are a cross sectional view and plan view of another example of the diffraction grating.
Figure 14B:
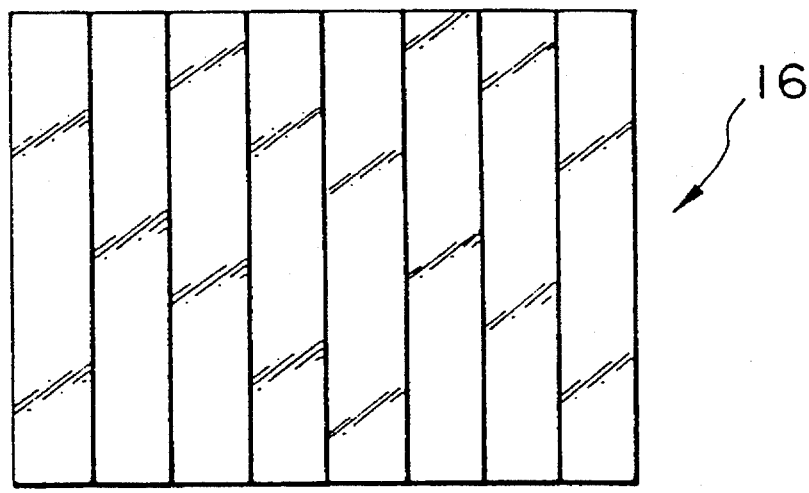

Another example of the diffraction grating is shown in FIGS. 14A and 14B, where FIG. 14A is a cross-sectional view and FIG. 14B is a plan view. In order to increase the first-order diffraction efficiency of this diffraction grating 16, the cross-sectional shape of the grating is made to be saw-toothed, as shown in FIG. 14A. In this case, the first-order diffraction efficiency $\eta_1$ is given by:

$$\eta_1 = \{\sin^2(\pi Y/\lambda)\}/(\pi Y/\lambda)^2$$

Note that $Y = d\Delta n - \lambda$. Therefore, when Y falls to zero, in other words, when $d = \lambda/\Delta n = \lambda/(n-1)$, $\eta_1 = 1$ and the diffraction efficiency is theoretically 100%. Therefore, if it is desired to increase the usage efficiency of a specific order of diffraction grating, it is effective to make the grating saw-toothed.

A typical process of forming the diffraction grating is a method in which a mask is first attached firmly to a glass substrate coated with a photoresist, UV light is shone thereon by a photolithography technique that is used in the fine processing of ICs and the like, then unwanted resist is etched away. The saw-toothed diffraction grating shown in FIGS. 14A and 14B is obtained by a method such as photolithography using a mask with light and dark markings, or by multiple exposures by an electron beam, or by machining.

Figure 15A:
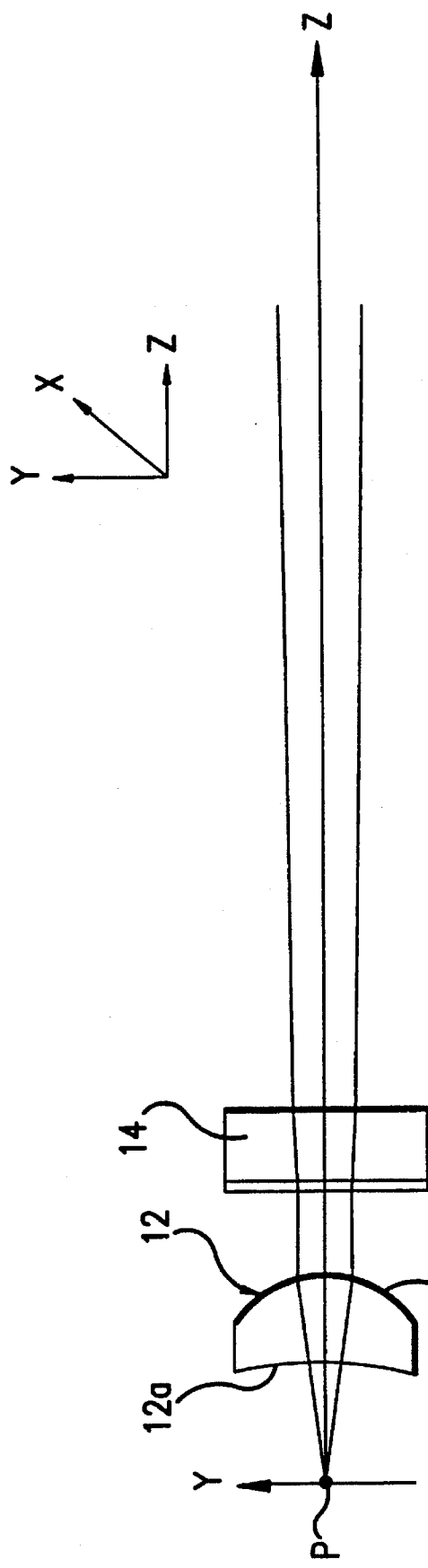
FIGS. 15A and 15B show a light-transmitting optical system of the third embodiment of the present invention, where
Figure 15B:
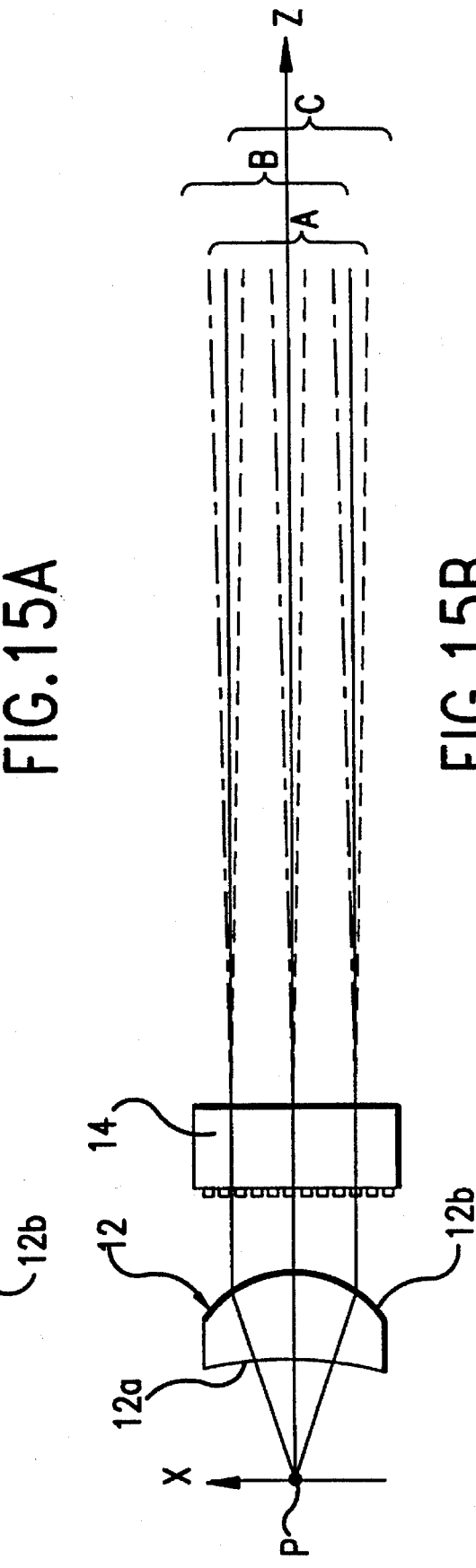

The beam pattern emitted from the semiconductor laser will now be described. If the horizontal direction is the X axis, the vertical direction is the Y axis, and the direction in which the beam propagates is the Z axis, the beam pattern over the Y-Z plane is shown in FIG. 15A and that over the X-Z plane is shown in FIG. 15B.

In the light-sensing device of this embodiment, the laser package 70 is fixed in such a manner that a connection surface between the semiconductor laser 100 and a support body 73 coincides with the Y-axis direction. The diffraction grating 14 is arranged with the grating grooves thereof also coinciding with the Y-axis direction. The first lens surface 12a of the toric lens 12 is configured with a Y-Z plane cross-section forming a spheric surface of radius R1 and a toric surface of radius R2, formed by rotating this spheric surface about an axis parallel to the Y axis. The second lens surface 12b is configured of an aspheric surface specified by the approximation expressed by Equation 1, that is rotationally symmetrical about the optical axis Z. The beam power density which is converted by the toric lens 12 can be adjusted by the configuration of the first and second lens surfaces. Therefore, the toric lens 12 is desirably configured relative to required beam power density. The examples of the configuration of the toric lens 12 are as follows:

| Example 1 | First lens surface 12a: | Radius R1 = −8.36 mm |
| | | Radius R2 = −50 mm |
| | Second lens surface 12b: | In Equation 1 |
| | | c = −0.3767 |
| | | k = −0.2228 |
| | | A = 0.1105 × 10⁻² |
| | | B = 0.3650 × 10⁻³ |
| Example 2 | First lens surface 12a: | Radius R1 = −40.8 mm |
| | | Radius R2 = 147.8 mm |
| | Second lens surface 12b: | In Equation 1 |
| | | c = −0.0917 |
| | | k = −0.645 |
| | | A = 0.265 × 10⁻⁴ |
| | | B = 0 |

The toric lens of Example 2 can make the converted beam power density larger than the toric lens of Example 1. Therefore, for example, even if first-order diffraction efficiency of the diffraction grating surface 14 is set smaller when the toric lens of Example 2 is used, it is possible to make the intensity of the positive first-order diffracted beam B and of negative first-order diffracted beam C, as shown in FIG. 15B about the same level as when the toric lens of Example 1 is used.

With the above configuration, the light emitted from the emission opening of the semiconductor laser (indicated by P in FIGS. 15A and 15B) of the light-sensing device is converted by the toric lens 12 into a beam that is substantially parallel, then it passes through the diffraction grating 14 and is split into three beams thereby. In other words, as shown in FIG. 15B, the light is divided into a zero-order diffracted beam (indicated by A) that proceeds substantially parallel to the optical axis Z, a positive first-order diffracted beam (indicated by B), and a negative first-order diffracted beam (indicated by C). With this optical system, since the light beam entering the diffraction grating 14 is approximately perpendicular thereto, the angle of projection of the laser light can be roughly controlled by adjusting the angle of diffraction caused by the diffraction grating. Therefore, since the angle of projection of the light can be considered to be simply the angle of diffraction of the positive/negative first-order diffracted light produced by the diffraction grating, this optical system has the advantage of providing simple control. Since the grating grooves of the diffraction grating 14 of this optical system are aligned in the Y-axis direction, the light diffraction occurs only in the X-Z plane and thus the light shining from the toric lens 12 in the Y-Z plane is incident without change.

Figure 16:
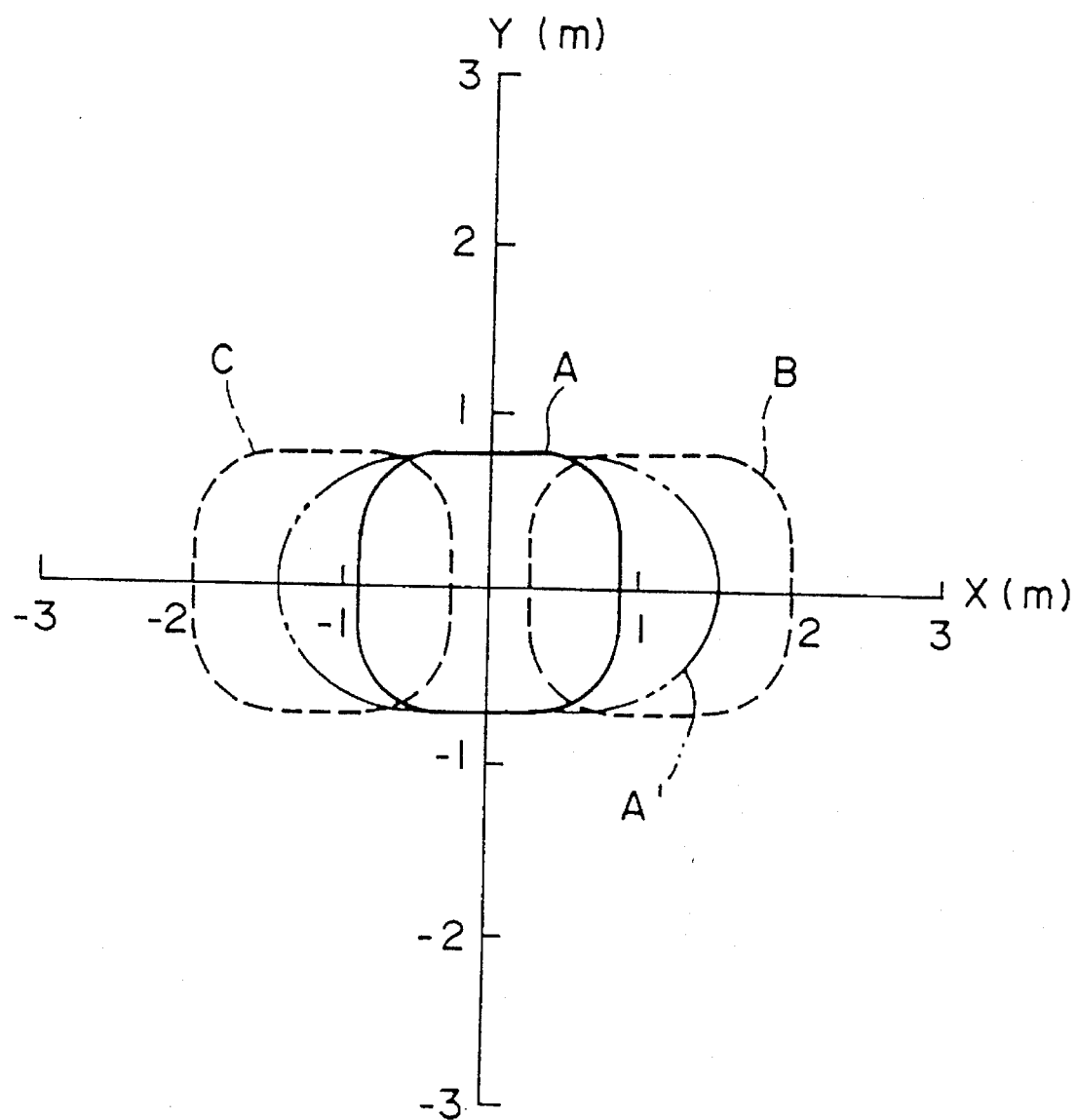
FIG. 16 shows a beam pattern of the third embodiment of the present invention.

The description now turns to the angle of projection and the diffraction efficiency of the light beam in this optical system. The angle of projection of the light beam is dependent on the pitch p of the diffraction grating and the diffraction efficiency of the light beam is dependent on the depth d of the grooves in the diffraction grating, and these values can be set to suitable ranges for application to devices such as light-sensing devices. This means that if the laser is used in range-finding radar, the intensity and dispersion region of emitted light could be set in consideration of the distance to the target. If, for example, the light-sensing device of this embodiment is applied to a vehicle-mounted obstacle detector that detects an obstacle in a predetermined direction with respect to a moving vehicle, a wide angle of projection is necessary in order to increase the measurable range in the region close to the moving vehicle, but it is also necessary to project the light as far as possible up to 100 meters ahead for example, in the direction of movement. More specifically, if a detection region of 40 meters ahead of the moving vehicle is taken as an example, it is necessary to have a detection region that is at least approximately 4 meters in the X-axis direction (horizontal direction) and at least approximately 1.5 meters in the Y-axis direction (vertical direction), as shown in FIG. 16. In order to obtain a detection region that is as wide as possible, the zero-order diffracted light A and the positive/negative first-order diffracted light B and C must overlap and be spread out in the X-axis direction as far as possible. Note that the ellipse shown by the broken line A' in FIG. 16 is the shape that the laser beam would have when it does not pass through the light-transmitting optical system.

Figure 17:
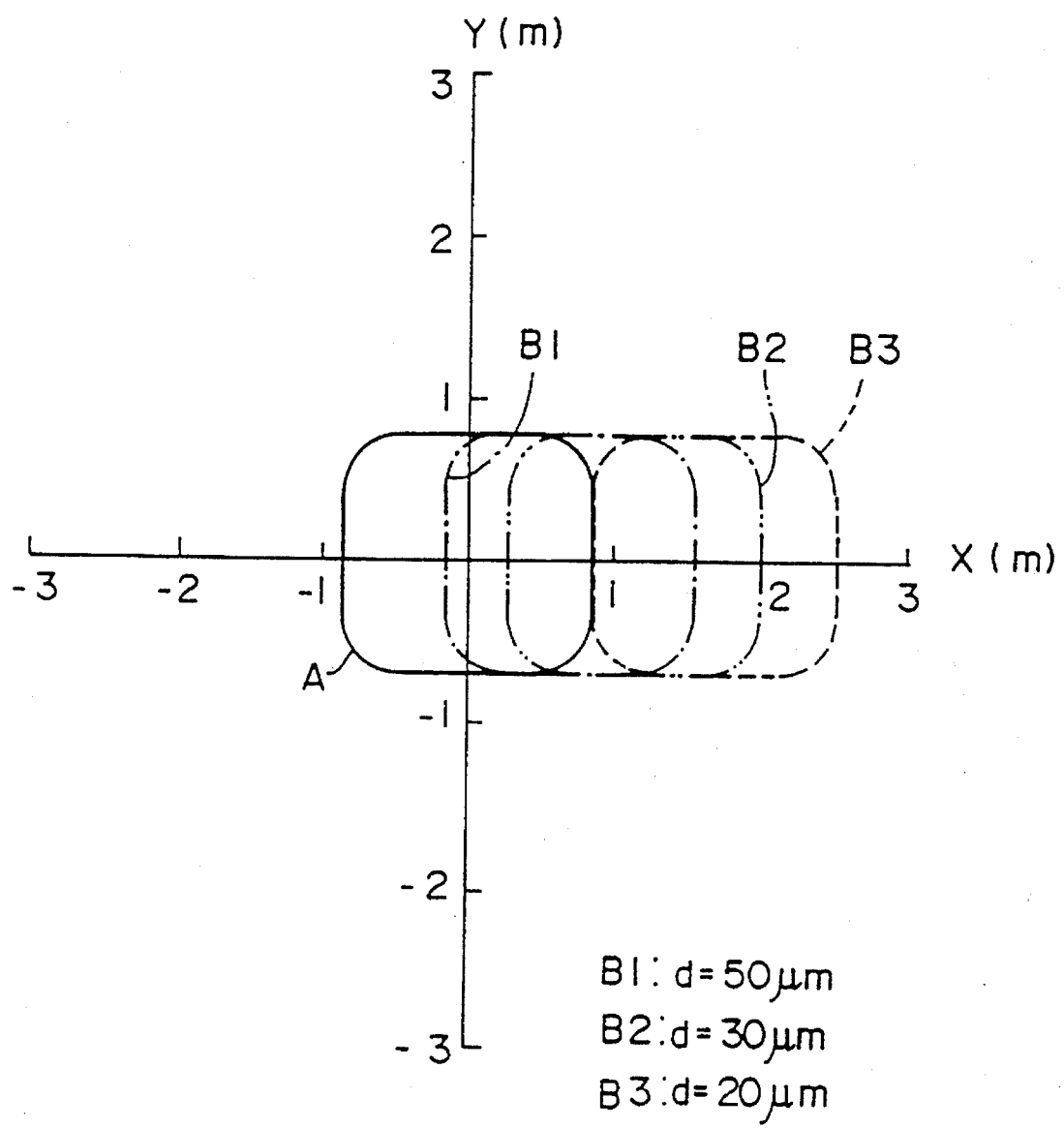
FIG. 17 shows variations in the beam pattern, obtained by changing the pitch of the diffraction grating.

If the pitch p of the diffraction grating is calculated in consideration of the above conditions, it is clear that a range of 20 μm to 50 μm is preferable. If the pitch p of the diffraction grating is too small, the first-order diffracted light is diffracted in a direction that deviates from the Y axis. With a grating pitch p of 20 μm, the illumination region contributed by the zero-order diffracted light just about touches the illumination region contributed by the first-order diffracted light, as shown by B3 in FIG. 17. If the grating pitch p is even smaller, the region of the zero-order diffracted light and the illumination region of first-order diffracted light separate to create a region in which detection is not possible. Note that only the zero-order diffracted light and positive first-order diffracted light beams are shown in FIG. 17, to simplify the diagram. If, on the other hand, the grating pitch p is 50 μm, the overlapping region between the zero-order diffracted illumination region and the first-order diffracted illumination region increases, as shown by B1, and it is clear that the detection region width narrows to approximately 3.2 meters.

As for the diffraction efficiency, on account of the condition for application to a vehicle-mounted obstacle detector, it is preferable that the zero-order diffraction efficiency is set to more than 50%. If the zero-order diffraction efficiency is equal to or less than 50%, it is difficult to guarantee a detection region that is necessary 100 meters ahead.

Figure 18:
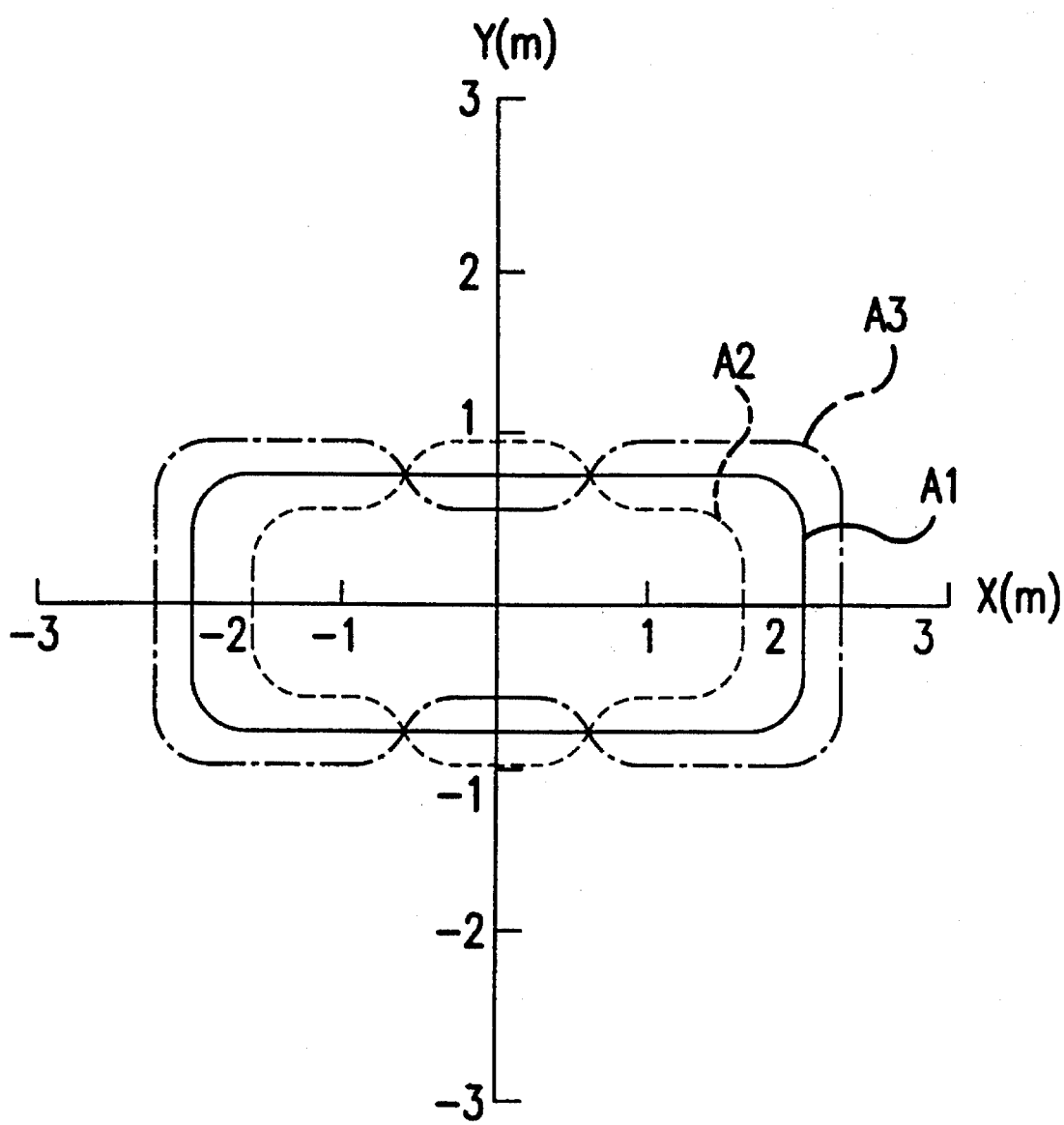
FIG. 18 shows beam patterns obtained when first-order diffracted light efficiency is varied.

The first-order diffraction efficiency is set within a range which satisfies said condition of the zero-order diffraction efficiency, and relative to a necessary detection region. For example, FIG. 18 shows a beam pattern of 40 meters ahead when the light-transmitting portion is configured using the toric lens 12 of said Example 1. When the first-order diffraction efficiency is set to 15%, 5% and 25%, the beam pattern changes respectively as indicated by A1, A2 and A3. Therefore, the first-order diffraction efficiency can be suitably set to satisfy a detection region of 40 meters ahead in the X-axis direction (approximately 4 meters, for example) and a detection region of 40 meters ahead in the Y-axis direction (approximately 1.5 meters, for example).

In other words, on account of the beam power density converted by the toric lens, it is possible to desirably set the first-order diffraction efficiency so as to guarantee a required detection region, by adjusting the depth d of the grating grooves of the diffraction grating.

In accordance with the light-sensing device of this embodiment, the toric lens 12 having both a toric surface and an aspheric surface enables the conversion of laser light into a measurement light beam of a predetermined shape and having sufficient light density. This laser light is then divided into three beams by the diffraction grating 14 and thus a predetermined beam width necessary for measurement can be obtained. Therefore, when this light-sensing device is applied to a vehicle-mounted obstacle detector, it is possible to obtain a suitable illumination region with little dead angle and a single light source.

Fourth Embodiment

Figure 19A:
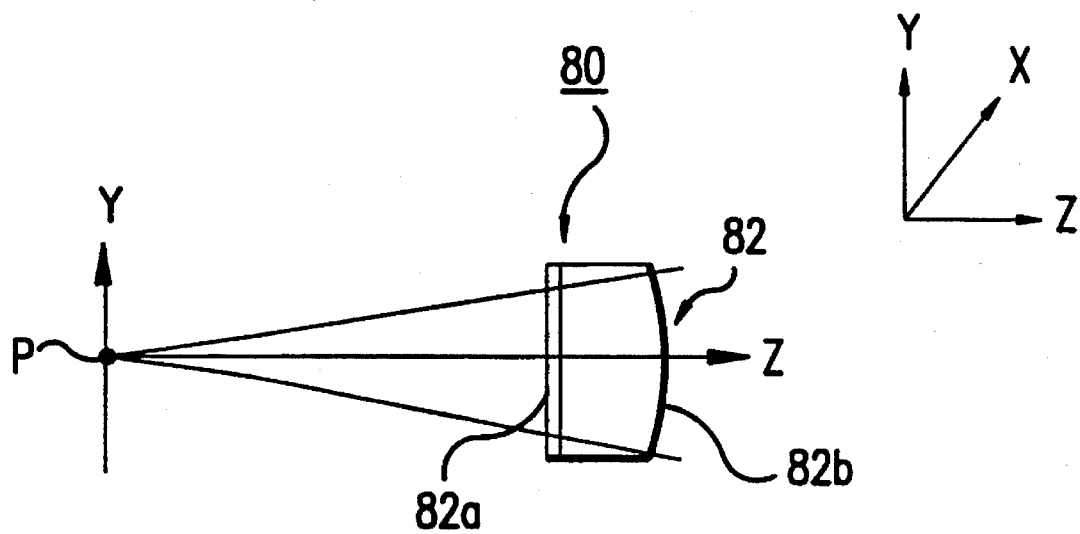
FIGS. 19A and 19B show a fourth embodiment of the present invention, where
Figure 19B:
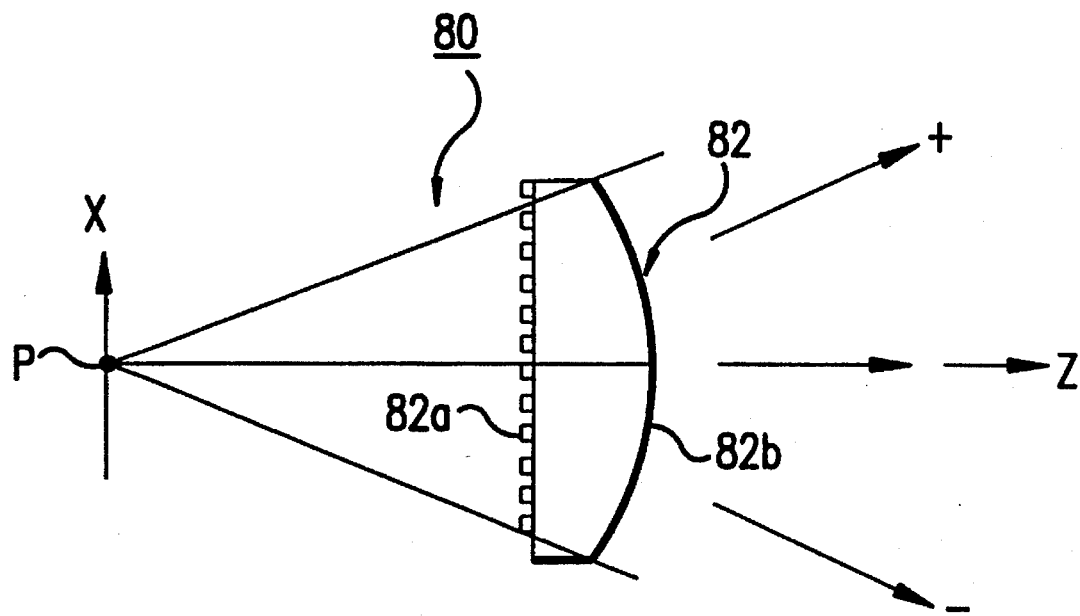

This embodiment differs from the third embodiment in the configuration of the light-transmitting optical system. A light-transmitting optical system 80 of this embodiment is shown in FIGS. 19A and 19B, where FIG. 19A shows the location of the lens in the Y-Z plane and FIG. 19B shows that in the X-Z plane.

In this embodiment, a lens 82 wherein a diffraction grating is formed on one lens surface is located on the optical axis Z. A first lens surface 82a on a light-source side of the lens 82 has a diffraction grating surface formed thereon, and this diffraction grating surface has grooves extending in the Y-axis direction. A second lens surface 82b of the lens 82 is configured of an aspheric surface (anamorphic aspheric surface) that is rotationally asymmetrical about the optical axis Z.

In the light-transmitting optical system 80 of the above described configuration, light emitted from a light source P is converted into three beams, a zero-order diffracted light beam along the Z-axis and positive/negative first-order diffracted light beams, as indicated by the "+" and "−" respectively, by the first lens surface 82a of the lens 82, and these elliptical beams are then converted into a roughly rectangular shape by the second lens surface 82b of the lens 82.

Use of the light-transmitting optical system of this configuration can provide the same effects as those of the third embodiment.

Note that the first lens surface 82a of the lens 82 could be an anamorphic aspheric surface and the second lens surface 82b thereof could be a diffraction grating surface.

In the above, the present invention has been described with reference to preferred embodiments thereof, but it should be obvious to those skilled in the art that the present invention is not limited thereto and can be modified in various ways within the scope of the invention.

What is claimed is:

1. A semiconductor laser comprising a substrate formed of a compound semiconductor of a first conductivity type, semiconductor layers deposited on one surface of said substrate, a current constriction layer having at least one stripe-shaped current injection region, and a pair of reflective layers formed on edge surfaces of said substrate and said semiconductor layers, wherein:

said semiconductor layers comprise:

a first cladding layer of the first conductivity type positioned on said substrate side, a first optical waveguide layer of the first conductivity type formed on said first cladding layer, an active layer formed on said first optical waveguide layer and having a quantum-well structure, a second optical waveguide layer of a second conductivity type formed on said active layer, a second cladding layer of the second conductivity type formed on said second optical waveguide layer, and a contact layer formed on said second cladding layer, and a blocking layer formed between at least one pair of said first cladding layer and said first optical waveguide layer, and said second cladding layer and said second optical waveguide layer; and wherein said active layer has flatness of such a degree that roughness with respect to a reference surface within a unit area of 1 mm×1 mm is no more than ±0.1 µm, the width of said current injection region of said current constriction layer is between 100 µm to 250 µm, the resonator length is between 500 µm to 1,000 µm;

the value of x in the $Al_xGa_{1-x}As$ of said first cladding layer and said second cladding layer is between 0.20 and 0.40; and said blocking laayer has a film thickness of 10 to 20 nm, and the value of x in the $Al_xGa_{1-x}As$ of said blocking layer is 0.30 to 0.60.

2. A semiconductor laser as defined in claim 1, wherein:

said semiconductor layers are formed of AlGaAs-type compound semiconductors.

3. A semiconductor laser as defined in claim 1, wherein:

said active layer comprises well and barrier layers, the value of x in the $Al_xGa_{1-x}As$ of a well layer is 0, the value of x in the $Al_xGa_{1-x}As$ of a barrier layer is between 0.15 to 0.25

4. A semiconductor laser as defined in claim 1, wherein:

said pair of reflective layers comprise a first reflective layer with a reflectivity of 0.1% to 5% and a second reflective layer with a reflectivity of at least 98.5%.

5. A semiconductor laser as defined in claim 4, wherein:

said reflective layers are each formed of one or more pairs of two thin dielectric films of differing refractive indices deposited alternately, such that in said first reflective layer a thin dielectric film with the larger refractive index is deposited on the semiconductor layers side, and in said second reflective layer a thin dielectric film with the smaller refractive index is deposited on the semiconductor layers side.

6. A light-sensing device comprising:

1) a semiconductor laser comprising a substrate formed of a compound semiconductor of a first conductivity type, semiconductor layers deposited on one surface of said substrate, a current constriction layer having at least one stripe-shaped current injection region, and a pair of reflective layers formed on edge surfaces of said substrate and said semiconductor layers, wherein:

said semiconductor layers comprise:

a first cladding layer of the first conductivity type positioned on said substrate side, a first optical waveguide layer of the first conductivity type formed on said first cladding layer, an active layer formed on said first optical waveguide layer and having a quantum-well structure, a second optical waveguide layer of a second conductivity type formed on said active layer, a second cladding layer of the second conductivity type formed on said second optical waveguide layer, and a contact layer formed on said second cladding layer, and wherein:

said active layer has flatness of such a degree that roughness with respect to a reference surface within a unit area of 1 mm×1 mm is no more than ±0.1 µm, the width of said current injection region of said current constriction layer is between 100 µm to 250 µm, the resonator length is between 500 µm to 1,000 µm;

2) a light-transmitting optical system comprising at least a diffraction grating surface and a lens surface having different refractive powers in two directions that are mutually orthogonal and are also orthogonal to an optical axis of light emitted from said semiconductor laser, on said optical axis; and 3) a light-receiving portion for detecting light which is the emitted light that is reflected back by an object to be detected;

wherein said light-transmitting optical system comprises an aspheric lens surface that is rotationally symmetrical about said optical axis.

7. A light-sensing device as defined in claim 6, wherein:

said lens surface having different refractive powers in two directions is a toric surface or anamorphic aspheric surface.

8. A light-sensing device as defined in claim 6, wherein:

said lens surface having different refractive powers in two directions is located closer to a light-source side than said diffraction grating surface.

9. A light-sensing device as defined in claim 6, wherein:

said diffraction grating surface and said lens surface having different refractive powers in two directions form a single lens body.

10. A light-sensing device comprising:

1) a semiconductor laser comprising a substrate formed of a compound semiconductor of a first conductivity type, semiconductor layers deposited on one surface of said substrate, a current constriction layer having at least one stripe-shaped current injection region, and a pair of reflective layers formed on edge surfaces of said substrate and said semiconductor layers, wherein:

said semiconductor layers comprise:

a first cladding layer of the first conductivity type positioned on said substrate side, a first optical waveguide layer of the first conductivity type formed on said first cladding layer, an active layer formed on said first optical waveguide layer and having a quantum-well structure, a second optical waveguide layer of a second conductivity type formed on said active layer, a second cladding layer of the second conductivity type formed on said second optical waveguide layer, and a contact layer formed on said second cladding layer, and wherein:

said active layer has flatness of such a degree that roughness with respect to a reference surface within a unit area of 1 mm×1 mm is no more than ±0.1 µm, the width of said current injection region of said current constriction layer is between 100 µm to 250 µm, the resonator length is between 500 µm to 1,000 µm;

2) a light-transmitting optical system comprising at least a diffraction grating surface and a lens surface having different refractive powers in two directions that are mutually orthogonal and are also orthogonal to an optical axis of light emitted from said semiconductor laser, on said optical axis; and 3) a light-receiving portion for detecting light which is the emitted light that is reflected back by an object to be detected;

wherein said diffraction grating surface has a grating pitch of 20 μm to 50 μm.

11. A light-sensing device as defined in claim 10, wherein:

said lens surface having different refractive powers in two directions is a toric surface or anamorphic aspheric surface.

12. A light-sensing device as defined in claim 10, wherein:

said lens surface having different refractive powers in two directions is located closer to a light-source side than said diffraction grating surface.

13. A light-sensing device as defined in claim 10, wherein:

said diffraction grating surface and said lens surface having different refractive powers in two directions form a single lens body.

14. A light-sensing device comprising:

1) a semiconductor laser comprising a substrate formed of a compound semiconductor of a first conductivity type, semiconductor layers deposited on one surface of said substrate, a current constriction layer having at least one stripe-shaped current injection region, and a pair of reflective layers formed on edge surfaces of said substrate and said semiconductor layers, wherein:

said semiconductor layers comprise:

a first cladding layer of the first conductivity type positioned on said substrate side, a first optical waveguide layer of the first conductivity type formed on said first cladding layer, an active layer formed on said first optical waveguide layer and having a quantum-well structure, a second optical waveguide layer of a second conductivity type formed on said active layer, a second cladding layer of the second conductivity type formed on said second optical waveguide layer, and a contact layer formed on said second cladding layer, and wherein:

said active layer has flatness of such a degree that roughness with respect to a reference surface within a unit area of 1 mm×1 mm is no more than ±0.1 μm, the width of said current injection region of said current constriction layer is between 100 μm to 250 μm, the resonator length is between 500 μm to 1,000 μm;

2) a light-transmitting optical system comprising at least a diffraction grating surface and a lens surface having different refractive powers in two directions that are mutually orthogonal and are also orthogonal to an optical axis of light emitted from said semiconductor laser, on an optical axis; and 3) a light-receiving portion for detecting light which is the emitted light that is reflected back by an object to be detected;

wherein light emitted from said semiconductor laser is divided into at least three beams by said diffraction grating surface, and said diffraction grating surface has zero-order diffraction efficiency of more than 50%.

15. A light-sensing device as defined in claim 14, wherein:

said lens surface having different refractive powers in two directions is a toric surface or anamorphic aspheric surface.

16. A light-sensing device as defined in claim 14, wherein:

said lens surface having different refractive powers in two directions is located closer to a light-source side than said diffraction grating surface.

17. A light-sensing device as defined in claim 14, wherein:

said diffraction grating surface and said lens surface having different refractive powers in two directions form a single lens body.

* * * * *